(12) United States Patent
Kazlas et al.

(10) Patent No.: US 8,405,063 B2
(45) Date of Patent: Mar. 26, 2013

(54) QUANTUM DOT LIGHT ENHANCEMENT SUBSTRATE AND LIGHTING DEVICE INCLUDING SAME

(75) Inventors: Peter T. Kazlas, Sudbury, MA (US); Seth Coe-Sullivan, Belmont, MA (US)

(73) Assignee: QD Vision, Inc., Lexington, MA (US)

( * ) Notice: Subject to any disclaimer, the term of this patent is extended or adjusted under 35 U.S.C. 154(b) by 159 days.

(21) Appl. No.: 12/657,427

(22) Filed: Jan. 20, 2010

(65) Prior Publication Data

US 2010/0283036 A1 Nov. 11, 2010

Related U.S. Application Data

(63) Continuation of application No. PCT/US2008/008924, filed on Jul. 23, 2008.

(60) Provisional application No. 60/951,427, filed on Jul. 23, 2007, provisional application No. 61/074,028, filed on Jun. 19, 2008.

(51) Int. Cl.
*H01L 29/06* (2006.01)
*H01L 29/20* (2006.01)
*H01L 33/00* (2010.01)
*H01L 31/00* (2006.01)

(52) U.S. Cl. ....... 257/9; 257/E29.071; 257/89; 257/440; 257/E27.142; 257/E31.121; 257/E31.122; 257/E31.123; 257/E51.022; 977/707; 977/712; 977/720; 977/723; 977/773; 977/774; 977/775; 977/776; 977/777; 977/779

(58) Field of Classification Search ....... 257/9, E29.071, 257/89, 440, E27.142, E31.121, E31.122, 257/E31.123, E51.022; 977/707, 712, 720, 977/723, 773–777, 779

See application file for complete search history.

(56) References Cited

U.S. PATENT DOCUMENTS

| | | | |
|---|---|---|---|
| 3,248,588 A | 4/1966 | Blazek et al. | |
| 3,510,732 A | 5/1970 | Amans et al. | |
| 3,774,086 A | 11/1973 | Vincent, Jr. | |
| 3,825,792 A | 7/1974 | Rokosz et al. | |
| 3,875,456 A | 4/1975 | Kano et al. | |
| 4,035,686 A | 7/1977 | Fleming | |
| 4,082,889 A | 4/1978 | DeStefano | |
| 4,130,343 A | 12/1978 | Miller et al. | |
| 4,366,407 A | 12/1982 | Walsh | |

(Continued)

FOREIGN PATENT DOCUMENTS

| | | |
|---|---|---|
| EP | 0328202 | 8/1989 |
| EP | 1731583 | 12/2006 |

(Continued)

OTHER PUBLICATIONS

Akimov, A., Et al, "Semiconductor nanocrystals in a polymeric matrix: new optical media" Opt. Spectrosc. 72 (4), Apr. 1992.

(Continued)

*Primary Examiner* — Ida M Soward

(57) ABSTRACT

A component including a substrate, at least one layer including a color conversion material including quantum dots disposed over the substrate, and a layer including a conductive material (e.g., indium-tin-oxide) disposed over the at least one layer. (Embodiments of such component are also referred to herein as a QD light-enhancement substrate (QD-LES).) In certain preferred embodiments, the substrate is transparent to light, for example, visible light, ultraviolet light, and/or infrared radiation. In certain embodiments, the substrate is flexible. In certain embodiments, the substrate includes an outcoupling element (e.g., a microlens array). A film including a color conversion material including quantum dots and a conductive material is also provided. In certain embodiments, a component includes a film described herein. Lighting devices are also provided. In certain embodiments, a lighting device includes a film described herein. In certain embodiments, a lighting device includes a component described herein.

32 Claims, 4 Drawing Sheets

U.S. PATENT DOCUMENTS

| | | | |
|---|---|---|---|
| 4,377,750 A | 3/1983 | Pape et al. |
| 4,382,272 A | 5/1983 | Quella et al. |
| 4,608,301 A | 8/1986 | Ishizuka et al. |
| 4,719,386 A | 1/1988 | Toho |
| 4,738,798 A | 4/1988 | Mahler |
| 4,766,526 A | 8/1988 | Morimoto et al. |
| 4,772,885 A | 9/1988 | Uehara et al. |
| 4,780,752 A | 10/1988 | Angerstein et al. |
| 4,820,016 A | 4/1989 | Cohen et al. |
| 4,902,567 A | 2/1990 | Eilertsen et al. |
| 4,929,053 A | 5/1990 | Muller-Stute et al. |
| 4,931,692 A | 6/1990 | Takagi et al. |
| 5,064,718 A | 11/1991 | Buscall et al. |
| 5,077,147 A | 12/1991 | Tanaka et al. |
| 5,208,462 A | 5/1993 | O'Connor et al. |
| 5,260,957 A | 11/1993 | Hakimi et al. |
| 5,294,870 A | 3/1994 | Tang et al. |
| 5,354,707 A * | 10/1994 | Chapple-Sokol et al. ...... 438/24 |
| 5,422,489 A | 6/1995 | Bhargava |
| 5,434,878 A | 7/1995 | Lawandy |
| 5,442,254 A | 8/1995 | Jaskie |
| 5,455,489 A | 10/1995 | Bhargava |
| 5,470,910 A | 11/1995 | Spanhel et al. |
| 5,504,661 A | 4/1996 | Szpak |
| 5,527,386 A | 6/1996 | Statz |
| 5,534,056 A | 7/1996 | Kuehule et al. |
| 5,586,879 A | 12/1996 | Szpak |
| 5,599,897 A | 2/1997 | Nishiguchi et al. |
| 5,677,545 A | 10/1997 | Shi et al. |
| 5,716,679 A | 2/1998 | Krug et al. |
| 5,717,289 A | 2/1998 | Tanaka |
| 5,777,433 A | 7/1998 | Lester et al. |
| 5,813,752 A | 9/1998 | Singer et al. |
| 5,813,753 A | 9/1998 | Vriens et al. |
| 5,847,507 A | 12/1998 | Butterworth et al. |
| 5,874,803 A | 2/1999 | Garbuzov et al. |
| 5,881,200 A | 3/1999 | Burt |
| 5,882,779 A | 3/1999 | Lawandy |
| 5,909,081 A | 6/1999 | Eida et al. |
| 5,917,279 A | 6/1999 | Elschner et al. |
| 5,955,528 A | 9/1999 | Sato et al. |
| 5,955,837 A | 9/1999 | Horikx et al. |
| 5,959,316 A | 9/1999 | Lowery |
| 5,962,971 A | 10/1999 | Chen |
| 5,975,711 A | 11/1999 | Parker et al. |
| 5,988,822 A | 11/1999 | Abe et al. |
| 6,005,342 A | 12/1999 | Morton |
| 6,005,707 A | 12/1999 | Berggren et al. |
| 6,023,371 A | 2/2000 | Onitsuka et al. |
| 6,048,616 A | 4/2000 | Gallagher et al. |
| 6,066,861 A | 5/2000 | Hohn et al. |
| 6,117,529 A | 9/2000 | Leising et al. |
| 6,236,060 B1 | 5/2001 | Chan et al. |
| 6,236,493 B1 | 5/2001 | Schmidt et al. |
| 6,249,372 B1 | 6/2001 | Kobayashi et al. |
| 6,259,606 B1 | 7/2001 | Lawandy |
| 6,322,901 B1 | 11/2001 | Bawendi et al. |
| 6,350,041 B1 | 2/2002 | Tarsa et al. |
| 6,358,652 B1 | 3/2002 | Tomiuchi et al. |
| 6,464,898 B1 | 10/2002 | Tomoike et al. |
| 6,482,664 B1 | 11/2002 | Lee et al. |
| 6,501,091 B1 | 12/2002 | Bawendi et al. |
| 6,515,314 B1 | 2/2003 | Duggal et al. |
| 6,548,834 B2 | 4/2003 | Sugawara et al. |
| 6,565,770 B1 | 5/2003 | Mayer et al. |
| 6,576,155 B1 | 6/2003 | Barbera-Guillem |
| 6,577,073 B2 | 6/2003 | Shimizu et al. |
| 6,580,545 B2 | 6/2003 | Morrison et al. |
| 6,586,096 B2 | 7/2003 | Border et al. |
| 6,600,175 B1 | 7/2003 | Baretz et al. |
| 6,608,332 B2 | 8/2003 | Shimizu et al. |
| 6,608,439 B1 * | 8/2003 | Sokolik et al. ............... 313/512 |
| 6,613,247 B1 | 9/2003 | Hohn et al. |
| 6,637,924 B2 | 10/2003 | Pelka et al. |
| 6,639,733 B2 | 10/2003 | Minano et al. |
| 6,641,755 B2 | 11/2003 | Tomoike et al. |
| 6,642,652 B2 | 11/2003 | Collins, III et al. |
| 6,650,044 B1 | 11/2003 | Lowery |
| 6,653,778 B1 | 11/2003 | Tomiuchi et al. |
| 6,677,610 B2 | 1/2004 | Choi et al. |
| 6,703,781 B2 | 3/2004 | Zovko |
| 6,710,366 B1 | 3/2004 | Lee et al. |
| 6,710,911 B2 | 3/2004 | LoCascio et al. |
| 6,714,711 B1 | 3/2004 | Lieberman et al. |
| 6,724,141 B2 | 4/2004 | Andriessen |
| 6,731,359 B1 | 5/2004 | Fukaya |
| 6,734,465 B1 | 5/2004 | Taskar et al. |
| 6,744,077 B2 | 6/2004 | Trottier et al. |
| 6,744,960 B2 | 6/2004 | Pelka |
| 6,746,889 B1 | 6/2004 | Eliashevich et al. |
| 6,777,706 B1 | 8/2004 | Tessler et al. |
| 6,777,719 B1 | 8/2004 | Fujii |
| 6,777,724 B2 | 8/2004 | Duggal et al. |
| 6,777,871 B2 | 8/2004 | Duggal et al. |
| 6,781,148 B2 | 8/2004 | Kubota et al. |
| 6,787,435 B2 | 9/2004 | Gibb et al. |
| 6,791,259 B1 | 9/2004 | Stokes et al. |
| 6,794,686 B2 | 9/2004 | Chang et al. |
| 6,799,864 B2 | 10/2004 | Bohler et al. |
| 6,801,270 B2 | 10/2004 | Faris et al. |
| 6,803,719 B1 | 10/2004 | Miller et al. |
| 6,812,500 B2 | 11/2004 | Reeh et al. |
| 6,819,845 B2 | 11/2004 | Lee et al. |
| 6,821,559 B2 | 11/2004 | Eberspacher et al. |
| 6,830,835 B2 | 12/2004 | Saito et al. |
| 6,835,326 B2 | 12/2004 | Barbera-Guillem |
| 6,838,743 B2 | 1/2005 | Yamada et al. |
| 6,851,831 B2 | 2/2005 | Karlicek, Jr. |
| 6,864,626 B1 | 3/2005 | Weiss et al. |
| 6,870,311 B2 | 3/2005 | Mueller et al. |
| 6,876,796 B2 | 4/2005 | Garito et al. |
| 6,885,033 B2 | 4/2005 | Andrews |
| 6,890,777 B2 | 5/2005 | Bawendi et al. |
| 6,891,330 B2 | 5/2005 | Duggal et al. |
| 6,902,990 B2 | 6/2005 | Gottfried et al. |
| 6,903,505 B2 | 6/2005 | McNulty et al. |
| 6,913,830 B2 | 7/2005 | Decker et al. |
| 6,914,265 B2 | 7/2005 | Bawendi et al. |
| 6,924,596 B2 | 8/2005 | Sato et al. |
| 6,957,608 B1 | 10/2005 | Hubert et al. |
| 7,005,667 B2 | 2/2006 | Chen et al. |
| 7,005,669 B1 | 2/2006 | Lee |
| 7,008,559 B2 | 3/2006 | Chen |
| 7,015,516 B2 | 3/2006 | Eliashevich et al. |
| 7,023,022 B2 | 4/2006 | Eliashevich et al. |
| 7,029,935 B2 | 4/2006 | Negley et al. |
| 7,040,774 B2 | 5/2006 | Beeson et al. |
| 7,042,020 B2 | 5/2006 | Negley |
| 7,045,956 B2 | 5/2006 | Braune et al. |
| 7,046,439 B2 | 5/2006 | Kaminsky et al. |
| 7,065,285 B2 | 6/2006 | Chen et al. |
| 7,066,623 B2 | 6/2006 | Lee et al. |
| 7,070,300 B2 | 7/2006 | Harbers et al. |
| 7,071,616 B2 | 7/2006 | Shimizu et al. |
| 7,075,225 B2 | 7/2006 | Baroky et al. |
| 7,078,732 B1 | 7/2006 | Reeh et al. |
| 7,090,355 B2 | 8/2006 | Liu et al. |
| 7,091,653 B2 | 8/2006 | Ouderkirk et al. |
| 7,091,656 B2 | 8/2006 | Murazaki et al. |
| 7,102,152 B2 | 9/2006 | Chua et al. |
| 7,110,299 B2 * | 9/2006 | Forbes ..................... 365/185.18 |
| 7,123,796 B2 | 10/2006 | Steckl et al. |
| 7,126,162 B2 | 10/2006 | Reeh et al. |
| 7,129,515 B2 | 10/2006 | Okuyama et al. |
| 7,135,816 B2 | 11/2006 | Kawaguchi et al. |
| 7,144,131 B2 | 12/2006 | Rains |
| 7,166,010 B2 | 1/2007 | Lamansky et al. |
| 7,170,100 B2 | 1/2007 | Erchak et al. |
| 7,175,948 B2 | 2/2007 | Yoshihara et al. |
| 7,190,870 B2 | 3/2007 | Sundar et al. |
| 7,196,354 B1 | 3/2007 | Erchak et al. |
| 7,199,393 B2 | 4/2007 | Park et al. |
| 7,213,940 B1 | 5/2007 | Van De Ven et al. |
| 7,226,856 B1 * | 6/2007 | Lopatin et al. ................ 438/629 |
| 7,235,792 B2 | 6/2007 | Elofson |
| 7,239,080 B2 | 7/2007 | Ng et al. |
| 7,242,030 B2 | 7/2007 | Wang et al. |

| | | | | | | |
|---|---|---|---|---|---|---|
| 7,245,065 B2 * | 7/2007 | Ghosh et al. ............... 313/110 | 2005/0051777 A1 | 3/2005 | Hill et al. | |
| 7,253,452 B2 | 8/2007 | Steckel et al. | 2005/0088079 A1 | 4/2005 | Daniels | |
| 7,264,527 B2 | 9/2007 | Bawendi et al. | 2005/0088380 A1 | 4/2005 | Bulovic et al. | |
| 7,265,488 B2 | 9/2007 | Ng et al. | 2005/0093422 A1 | 5/2005 | Wang et al. | |
| 7,273,309 B2 | 9/2007 | Ford et al. | 2005/0093430 A1 | 5/2005 | Ibbetson et al. | |
| 7,279,716 B2 * | 10/2007 | Chen ............... 257/94 | 2005/0098787 A1 | 5/2005 | Andrews | |
| 7,279,832 B2 | 10/2007 | Thurk et al. | 2005/0134723 A1 | 6/2005 | Lee et al. | |
| 7,294,881 B2 | 11/2007 | Korenari et al. | 2005/0135079 A1 | 6/2005 | Yin Chua et al. | |
| 7,321,193 B2 | 1/2008 | Antoniadis et al. | 2005/0139852 A1 | 6/2005 | Chen et al. | |
| 7,326,365 B2 | 2/2008 | Bawendi et al. | 2005/0180680 A1 | 8/2005 | Kong | |
| 7,326,908 B2 * | 2/2008 | Sargent et al. ............. 250/214.1 | 2005/0214967 A1 | 9/2005 | Scher et al. | |
| 7,350,933 B2 | 4/2008 | Ng et al. | 2005/0236556 A1 | 10/2005 | Sargent et al. | |
| 7,374,807 B2 | 5/2008 | Parce et al. | 2005/0261400 A1 | 11/2005 | Yang et al. | |
| 7,393,618 B2 * | 7/2008 | Ioku et al. ............... 430/7 | 2005/0265404 A1 | 12/2005 | Ashdown | |
| 7,420,323 B2 | 9/2008 | Krummacher | 2005/0271548 A1 | 12/2005 | Yang et al. | |
| 7,430,355 B2 | 9/2008 | Heikenfeld et al. | 2005/0272159 A1 | 12/2005 | Ismagilov et al. | |
| 7,462,502 B2 | 12/2008 | Paolini et al. | 2005/0275615 A1 | 12/2005 | Kahen et al. | |
| 7,473,922 B2 * | 1/2009 | Uchiyama et al. ............... 257/14 | 2005/0279949 A1 | 12/2005 | Oldham et al. | |
| 7,481,562 B2 | 1/2009 | Chua et al. | 2006/0001036 A1 | 1/2006 | Jacob et al. | |
| 7,495,383 B2 | 2/2009 | Chua et al. | 2006/0002101 A1 | 1/2006 | Wheatley | |
| 7,497,581 B2 | 3/2009 | Beeson et al. | 2006/0003097 A1 | 1/2006 | Andres et al. | |
| 7,513,669 B2 | 4/2009 | Chua et al. | 2006/0003114 A1 | 1/2006 | Enlow et al. | |
| 7,522,647 B2 * | 4/2009 | Hatori et al. ............... 372/45.01 | 2006/0003156 A1 | 1/2006 | Masutani et al. | |
| 7,534,002 B2 | 5/2009 | Yamaguchi et al. | 2006/0024525 A1 | 2/2006 | Jeong et al. | |
| 7,535,524 B2 | 5/2009 | Chua et al. | 2006/0034065 A1 | 2/2006 | Thurk | |
| 7,553,683 B2 | 6/2009 | Martin et al. | 2006/0043361 A1 * | 3/2006 | Lee et al. ............... 257/40 |
| 7,554,257 B2 | 6/2009 | Krummacher et al. | 2006/0057460 A1 | 3/2006 | Matthias et al. | |
| 7,560,747 B2 | 7/2009 | Cok | 2006/0060862 A1 | 3/2006 | Bawendi et al. | |
| 7,592,618 B2 * | 9/2009 | Khang et al. ............... 257/13 | 2006/0063029 A1 * | 3/2006 | Jang et al. ............... 428/690 |
| 7,595,508 B2 * | 9/2009 | Otsubo et al. ............... 257/79 | 2006/0063289 A1 | 3/2006 | Negley et al. | |
| 7,614,759 B2 | 11/2009 | Negley | 2006/0065902 A1 | 3/2006 | Todori et al. | |
| 7,645,397 B2 | 1/2010 | Parce et al. | 2006/0066210 A1 | 3/2006 | Ng et al. | |
| 7,679,102 B2 * | 3/2010 | Chik et al. ............... 257/102 | 2006/0068154 A1 | 3/2006 | Parce et al. | |
| 7,682,850 B2 | 3/2010 | Harbers et al. | 2006/0081862 A1 | 4/2006 | Chua et al. | |
| 7,686,493 B2 | 3/2010 | Roshan et al. | 2006/0103589 A1 | 5/2006 | Chua et al. | |
| 7,692,373 B2 | 4/2010 | Bawendi et al. | 2006/0105483 A1 | 5/2006 | Leatherdale et al. | |
| 7,710,026 B2 | 5/2010 | Cok et al. | 2006/0113895 A1 | 6/2006 | Baroky et al. | |
| 7,722,422 B2 * | 5/2010 | Cok ............... 445/23 | 2006/0145599 A1 | 7/2006 | Stegamat et al. | |
| 7,723,744 B2 | 5/2010 | Gillies et al. | 2006/0147703 A1 | 7/2006 | Walker et al. | |
| 7,732,237 B2 * | 6/2010 | Xie ............... 438/47 | 2006/0157686 A1 | 7/2006 | Jang et al. | |
| 7,732,823 B2 * | 6/2010 | Kawaguchi ............... 257/79 | 2006/0157720 A1 | 7/2006 | Bawendi et al. | |
| 7,750,425 B2 * | 7/2010 | Forrest et al. ............... 257/441 | 2006/0169971 A1 | 8/2006 | Cho et al. | |
| 7,791,092 B2 | 9/2010 | Tarsa et al. | 2006/0196375 A1 | 9/2006 | Coe-Sullivan et al. | |
| 7,795,609 B2 * | 9/2010 | Huffaker et al. ............... 257/14 | 2006/0197437 A1 | 9/2006 | Krummacher et al. | |
| 7,799,586 B2 | 9/2010 | Leung et al. | 2006/0199886 A1 | 9/2006 | Ryang | |
| 7,813,160 B2 * | 10/2010 | Drndic et al. ............... 365/151 | 2006/0204676 A1 | 9/2006 | Jones et al. | |
| 7,880,377 B2 * | 2/2011 | Orita et al. ............... 313/503 | 2006/0204679 A1 | 9/2006 | Jones et al. | |
| 7,888,700 B2 | 2/2011 | Kahen | 2006/0210726 A1 | 9/2006 | Jones et al. | |
| 7,901,111 B2 | 3/2011 | Negley et al. | 2006/0214903 A1 | 9/2006 | Kurosaka | |
| 7,902,748 B2 * | 3/2011 | Cok ............... 313/506 | 2006/0215958 A1 | 9/2006 | Yeo et al. | |
| 7,952,105 B2 | 5/2011 | Cok | 2006/0221021 A1 | 10/2006 | Hajjar et al. | |
| 7,969,085 B2 * | 6/2011 | Cok ............... 313/504 | 2006/0227546 A1 | 10/2006 | Yeo et al. | |
| 7,982,396 B2 * | 7/2011 | Cok ............... 313/506 | 2006/0232725 A1 | 10/2006 | Chua et al. | |
| 8,033,706 B1 * | 10/2011 | Kelly et al. ............... 362/607 | 2006/0238103 A1 | 10/2006 | Choi et al. | |
| 8,044,414 B2 * | 10/2011 | Hori et al. ............... 257/88 | 2006/0238671 A1 | 10/2006 | Kim et al. | |
| 8,053,972 B2 | 11/2011 | Bawendi et al. | 2006/0244367 A1 | 11/2006 | Im et al. | |
| 8,174,034 B2 | 5/2012 | Bogner et al. | 2006/0245710 A1 | 11/2006 | Borrelli et al. | |
| 8,174,181 B2 * | 5/2012 | Bawendi et al. ............... 313/503 | 2006/0274226 A1 | 12/2006 | Im et al. | |
| 2001/0001207 A1 | 5/2001 | Shimizu et al. | 2006/0279296 A1 | 12/2006 | Lee et al. | |
| 2001/0028055 A1 * | 10/2001 | Fafard et al. ............... 257/17 | 2007/0012928 A1 | 1/2007 | Peng et al. | |
| 2002/0053359 A1 * | 5/2002 | Harman et al. ............... 136/205 | 2007/0012941 A1 | 1/2007 | Cheon | |
| 2002/0071948 A1 | 6/2002 | Duff et al. | 2007/0013996 A1 | 1/2007 | Verma | |
| 2002/0127224 A1 | 9/2002 | Chen | 2007/0014318 A1 | 1/2007 | Hajjar et al. | |
| 2002/0136932 A1 * | 9/2002 | Yoshida ............... 428/698 | 2007/0018102 A1 | 1/2007 | Braune et al. | |
| 2002/0186921 A1 | 12/2002 | Schumacher et al. | 2007/0018558 A1 | 1/2007 | Chua et al. | |
| 2003/0030706 A1 | 2/2003 | Jagannathan et al. | 2007/0034833 A1 | 2/2007 | Parce et al. | |
| 2003/0034486 A1 | 2/2003 | Korgel | 2007/0036510 A1 | 2/2007 | Ingman et al. | |
| 2003/0151700 A1 | 8/2003 | Carter et al. | 2007/0036962 A1 | 2/2007 | Sasaki et al. | |
| 2003/0156425 A1 | 8/2003 | Turnbull et al. | 2007/0045777 A1 | 3/2007 | Gillies et al. | |
| 2003/0160260 A1 | 8/2003 | Hirai et al. | 2007/0071218 A1 | 3/2007 | Zhang | |
| 2003/0227249 A1 | 12/2003 | Mueller et al. | 2007/0077594 A1 | 4/2007 | Hikmet et al. | |
| 2003/0230970 A1 | 12/2003 | Steckl et al. | 2007/0085092 A1 | 4/2007 | Chen et al. | |
| 2004/0007169 A1 | 1/2004 | Ohtsu et al. | 2007/0087197 A1 | 4/2007 | Jang et al. | |
| 2004/0135495 A1 | 7/2004 | Wu et al. | 2007/0090755 A1 | 4/2007 | Eida et al. | |
| 2004/0233139 A1 | 11/2004 | Asano et al. | 2007/0096078 A1 | 5/2007 | Lee et al. | |
| 2004/0245912 A1 | 12/2004 | Thurk et al. | 2007/0096634 A1 | 5/2007 | Krummacher | |
| 2004/0259363 A1 | 12/2004 | Bawendi et al. | 2007/0103068 A1 | 5/2007 | Bawendi et al. | |
| 2004/0262583 A1 | 12/2004 | Lee | 2007/0108888 A1 * | 5/2007 | Chen et al. ............... 313/503 |
| 2005/0012076 A1 | 1/2005 | Morioka | 2007/0112097 A1 | 5/2007 | Olson et al. | |

| | | |
|---|---|---|
| 2007/0112101 A1 | 5/2007 | Choi et al. |
| 2007/0112118 A1 | 5/2007 | Park et al. |
| 2007/0115995 A1 | 5/2007 | Kim et al. |
| 2007/0121129 A1 | 5/2007 | Eida et al. |
| 2007/0131905 A1 | 6/2007 | Sato et al. |
| 2007/0145350 A1 | 6/2007 | Kobori |
| 2007/0164661 A1 | 7/2007 | Kuma |
| 2007/0170418 A1 | 7/2007 | Bowers et al. |
| 2007/0170447 A1 | 7/2007 | Negley et al. |
| 2007/0177380 A1* | 8/2007 | Schultz et al. ............... 362/249 |
| 2007/0190675 A1* | 8/2007 | Yamazaki et al. .............. 438/22 |
| 2007/0200492 A1 | 8/2007 | Cok et al. |
| 2007/0201056 A1 | 8/2007 | Cok et al. |
| 2007/0223219 A1 | 9/2007 | Medendorp et al. |
| 2007/0235751 A1 | 10/2007 | Radkov et al. |
| 2007/0241661 A1 | 10/2007 | Yin |
| 2007/0246734 A1 | 10/2007 | Lee et al. |
| 2007/0263408 A1 | 11/2007 | Chua et al. |
| 2007/0281140 A1 | 12/2007 | Haubrich et al. |
| 2007/0298160 A1 | 12/2007 | Jang et al. |
| 2008/0001124 A1 | 1/2008 | Hachiya et al. |
| 2008/0001167 A1 | 1/2008 | Coe-Sullivan et al. |
| 2008/0001528 A1 | 1/2008 | Eida |
| 2008/0007156 A1* | 1/2008 | Gibson et al. ............... 313/503 |
| 2008/0012031 A1 | 1/2008 | Jang et al. |
| 2008/0029710 A1 | 2/2008 | Sekiya et al. |
| 2008/0036367 A1 | 2/2008 | Eida et al. |
| 2008/0048936 A1 | 2/2008 | Powell et al. |
| 2008/0057342 A1 | 3/2008 | Sekiya |
| 2008/0070153 A1 | 3/2008 | Ioku et al. |
| 2008/0074050 A1 | 3/2008 | Chen et al. |
| 2008/0116784 A1 | 5/2008 | Krummacher et al. |
| 2008/0135914 A1* | 6/2008 | Krishna et al. ............... 257/316 |
| 2008/0144333 A1 | 6/2008 | Gourlay |
| 2008/0165235 A1 | 7/2008 | Rolly et al. |
| 2008/0169753 A1 | 7/2008 | Skipor et al. |
| 2008/0172197 A1 | 7/2008 | Skipor et al. |
| 2008/0173886 A1 | 7/2008 | Cheon et al. |
| 2008/0218068 A1* | 9/2008 | Cok ............... 313/505 |
| 2008/0237540 A1 | 10/2008 | Dubrow |
| 2008/0237611 A1* | 10/2008 | Cok et al. ............... 257/79 |
| 2008/0254210 A1 | 10/2008 | Lai et al. |
| 2008/0277626 A1 | 11/2008 | Yang et al. |
| 2008/0278063 A1* | 11/2008 | Cok ............... 313/500 |
| 2008/0297028 A1 | 12/2008 | Kane et al. |
| 2008/0308825 A1 | 12/2008 | Chakraborty et al. |
| 2009/0001386 A1 | 1/2009 | Skipor et al. |
| 2009/0002806 A1 | 1/2009 | Skipor et al. |
| 2009/0017268 A1 | 1/2009 | Skipor et al. |
| 2009/0021148 A1 | 1/2009 | Hachiya et al. |
| 2009/0034292 A1 | 2/2009 | Pokrovskiy et al. |
| 2009/0050907 A1 | 2/2009 | Yuan et al. |
| 2009/0057662 A1 | 3/2009 | Brazis et al. |
| 2009/0059554 A1 | 3/2009 | Skipor et al. |
| 2009/0114932 A1 | 5/2009 | Chou |
| 2009/0152567 A1 | 6/2009 | Comerford et al. |
| 2009/0162011 A1 | 6/2009 | Coe-Sullivan et al. |
| 2009/0174022 A1 | 7/2009 | Coe-Sullivan et al. |
| 2009/0181478 A1 | 7/2009 | Cox et al. |
| 2009/0196160 A1 | 8/2009 | Crombach |
| 2009/0208753 A1 | 8/2009 | Coe-Sullivan et al. |
| 2009/0212695 A1 | 8/2009 | Kim et al. |
| 2009/0215208 A1 | 8/2009 | Coe-Sullivan et al. |
| 2009/0215209 A1 | 8/2009 | Anc et al. |
| 2009/0236621 A1 | 9/2009 | Chakraborty |
| 2009/0278141 A1 | 11/2009 | Coe-Sullivan et al. |
| 2009/0280586 A1 | 11/2009 | Coe-Sullivan |
| 2009/0283742 A1 | 11/2009 | Coe-Sullivan et al. |
| 2009/0286338 A1 | 11/2009 | Coe-Sullivan et al. |
| 2009/0321755 A1 | 12/2009 | Jang et al. |
| 2010/0002414 A1 | 1/2010 | Meir et al. |
| 2010/0014799 A1 | 1/2010 | Bulovic et al. |
| 2010/0025595 A1 | 2/2010 | Bawendi et al. |
| 2010/0044635 A1 | 2/2010 | Breen et al. |
| 2010/0044636 A1 | 2/2010 | Ramprasad et al. |
| 2010/0051870 A1 | 3/2010 | Ramprasad |
| 2010/0051898 A1 | 3/2010 | Kim et al. |
| 2010/0052512 A1 | 3/2010 | Clough et al. |
| 2010/0067214 A1 | 3/2010 | Hoelen et al. |
| 2010/0068468 A1 | 3/2010 | Coe-Sullivan et al. |
| 2010/0090597 A1* | 4/2010 | Werners et al. ............... 313/512 |
| 2010/0103648 A1 | 4/2010 | Kim et al. |
| 2010/0110728 A1 | 5/2010 | Dubrow et al. |
| 2010/0113813 A1 | 5/2010 | Pickett et al. |
| 2010/0123155 A1 | 5/2010 | Pickett et al. |
| 2010/0142182 A1 | 6/2010 | Van Woudenberg et al. |
| 2010/0144231 A1 | 6/2010 | Landry et al. |
| 2010/0149814 A1 | 6/2010 | Zhai et al. |
| 2010/0155749 A1 | 6/2010 | Chen et al. |
| 2010/0167011 A1 | 7/2010 | Dubrow |
| 2010/0193806 A1 | 8/2010 | Byun |
| 2010/0208493 A1 | 8/2010 | Choi et al. |
| 2010/0243053 A1 | 9/2010 | Coe-Sullivan et al. |
| 2010/0246009 A1 | 9/2010 | Polley et al. |
| 2010/0265307 A1 | 10/2010 | Linton et al. |
| 2010/0283036 A1 | 11/2010 | Coe-Sullivan et al. |
| 2010/0283072 A1* | 11/2010 | Kazlas et al. ............... 257/98 |
| 2010/0301360 A1 | 12/2010 | Van de Ven et al. |
| 2011/0025224 A1 | 2/2011 | Wood et al. |
| 2011/0299001 A1 | 12/2011 | Banin et al. |

FOREIGN PATENT DOCUMENTS

| | | |
|---|---|---|
| JP | 1260707 | 10/1989 |
| JP | 02-244104 | 9/1990 |
| JP | 04-229807 | 8/1992 |
| JP | 4238304 | 8/1992 |
| JP | 04-281433 | 10/1992 |
| JP | 05-152609 | 6/1993 |
| JP | 05-303017 | 11/1993 |
| JP | 06-238161 | 8/1994 |
| JP | 06-301071 | 10/1994 |
| JP | 07-002912 | 1/1995 |
| JP | 07-176794 | 7/1995 |
| JP | 08-007614 | 1/1996 |
| JP | 09-027642 | 1/1997 |
| JP | 09-050057 | 2/1997 |
| JP | 09-080434 | 3/1997 |
| JP | 10-012925 | 1/1998 |
| JP | 2002-216962 | 8/2002 |
| JP | 2006-073869 | 3/2008 |
| WO | WO-03/070816 | 8/2003 |
| WO | WO-03/079414 | 9/2003 |
| WO | WO-2006/104689 | 10/2006 |
| WO | WO-2007/002234 | 1/2007 |
| WO | WO-2007/009010 | 1/2007 |
| WO | WO-2007/046649 | 4/2007 |
| WO | WO-2007/136816 | 11/2007 |
| WO | WO-2008029633 | 8/2008 |
| WO | WO-2009/002512 | 12/2008 |
| WO | WO-2009/011922 | 1/2009 |
| WO | WO-2009/014590 | 1/2009 |
| WO | WO-2009/014707 A9 | 1/2009 |
| WO | WO-2009/137053 | 11/2009 |
| WO | WO-2009/145813 | 12/2009 |
| WO | WO-2009/151515 | 12/2009 |
| WO | WO-2010/014205 | 2/2010 |
| WO | WO-2011/020098 | 2/2011 |

OTHER PUBLICATIONS

Anineeva P.O., Et al., "Photoluminescence of CdSe/ZnS Core/Shell Quantum Dots Enhanced by Energy Transfer from a Phosphorescent Donor," Chemical Physics Letters, 424, 120 (2006).
Baldo M. A., Et al., Forrest, *Appl. Phys. Lett.* 1999, 75, 4.
Baldo M.A., Et al., Applied Physics Letters. 75. 4-6 (1999).
Baldo M.A., Et al., Nature. 395. 151-154 (1998).
Baldo M.A., Et al., Nature. 403. 750-753 (2000).
Baldo M.A., Et al., Physical Review B. 66. 035321 (2002).
Baldo M.A., Et al. Physical Review B vol. 62, No. 16 (2000).
Baldo M.A., Et al. Pure Appl. Chem. vol. 71, No. 11 (1999).
Bawendl M. G., El al., *J. Chem. Phys.* 1989, 91, 7282.
Calebi K., Et al., Optics Express, 15 1762-1772 (2007).
Chan Y., Et al., "Blue semiconductor nanocrystal laser", Applied Physics Letters, 86, 073102 (2005).
Chan Y., Et al., "Incorporation of Luminescent Nanocrystals into Monodisperse Core-Shell Silica Microspheres", Advanced Materials, 16, 2092 (2004).

Chen M., Et al., vol. 46, 2007 pp. 1521-1525.
Coe Sullivan S., Et al,, "Electroluminescence of Single Monolayer of Nanocrystals in Molecular Organic Devices", Nature (London) 420, 800 (2002).
Coe-Sullivan S., El al., "Method for fabrication of saturated RGB quantum dot light-emitting devices", Proc. of SPIE Int. Soc. Opt. Eng., 108, 5739 (2005).
Coe-Sullivan S., Et al., "Tuning the Performance of Hybrid Organic/Inorganic Quantum Dot Light-Emitting Devices", Organic Electronics, 4, 123 (2003).
Dabbousi, B. O., Et al. *Appl. Phys. Lett.* 1995, 66, 1316.
Dabbousi, B. O., Et al. *J. Phys. Chem.* B 1997, 101, 9463.
Danek, et al. J. Amer.Chem. Soc., 1996.
Do Y. R., Et al., *J. Appl. Phys.* 2004, 96, 7629.
Do Y. R., Et al., *Adv. Mater.* 2003, 15, 1214.
Empedocles, S.A. Et al, "Photoluminescence Spectrosopy of Single CdSe Nanocrystallite Quantum Dots" vol. 77, No. 18, Oct. 28, 1996.
Firth, A.V., Et al., "Optical Properties of CdSe nanocrystals in a polymer matrix", Applied Physics Letters, vol. 75, No. 20, 3120 et seq. (1999).
Fogg, D.E. Et al, "Fabrication of Quantum Dot-Polymer Composites: Semiconductor Nanoclusters in Dual-Function Polymer Matrices with Electron-Transpoding and Cluster-Passivating Properties" Macromolecules 1997, 30, 8433-8439.
Fuchs T., Et al., "Making waveguldes containing nanocrystalline quantum dots", Proc.of SPIE, 5592, 265 (2004).
Fujita M., Et al., *Jpn. J. Appl. Phys.* 2006, 44, 3669.
Greenham, N.C., Et al, "Charge seperation and transport in conjugated-polymer/semiconductor-nanocrystal composites studied by photoluminescense quenching and photoconductivity" Physical Review B vol. 54, No. 24, Dec. 15, 1996, pp. I7628-17637.
Gu, G., Et al. *Opt. Lett.*1997, 22, 396.
Hines M. A., Et al., *Adv. Mater.* 2003, 15, 1844.
Hines M. A., Et al., *J. Phys. Chem.* 1996, 100, 468.
Huang W., Et al., Jpn. J. Appl. Phys. vol. 45, No. 41, 2006.
Ida N. Et al., "Organic Light Emitting Diode (OLED) and its application to lighting devices," SPIE Proceedings, 6333, 63330M (2005).
Ishihara K., El al., *Appl. Phys. Lett.* 2007, 90, 111114.
Jordan R. H., Et al., *Appl. Phys. Lett.* 1998, 69, 1997.
Kagan, et al. , Physical Review B vol. 54, No. 12 Sep. 15, 1996.
Kazlas P., Et al., "Progress in Developing High Efficiency Quantum Dot Displays" SID'07 Digest, p. 176 (2007).
Kim Y. —C., S. Et al., *Appl. Phys. Lett.* 2008, 89, 173502.
Kim L.A., Et al., Nano Letters, vol. xx, No. x, XXXX, Aug. 18, 2008.
Kortan, et al., J. Amer. Chem. Soc., 1990, 112, 1327.
Krummacher B.C., J. Appl. Phys. 100 054702 (2006).
LaMer V. K., Et al., *J. Am. Chem.* Soc. 1960, 72, 4847.
Lee Y. —J., Et al., *Appl. Phys. Lett.* 2003, 82, 3779.
Lee, Et al., "Full Color Emission From II-VI Semiconductor Quantum-Dot Polymer Composites". Adv. Mater. 2000, 12, No. 15 Aug. 2, pp. 1102-1105.
Lim, et al. Adv. Mater. 2007, 19, 1927-1932.
Madigan, C. F., Et al. *Appl. Phys. Lett.* 2000, 76, 1650.
Mikulec, F.V. Et al, "Synthesis and Characterization of Highly Luminescent (CdSe)ZnS Quantum Dots" Met. lies. Soc. Symp. Proc. vol. 452 1997 Materials Research Society.
Moeller G., Et al. "Quantum-Dot Light—Emitting Devices for Displays" SID'06 Digest (2006).
Moller S. Et al., *J. Appl. Phys.* 2002, 91, 3324.

Mulder C.L., Et al., Applied Physics Letters. 90. 211109 (2007).
Murray, C. B., Et al. *Annu. Rev. Mater. Sci.* 2000, 30, 545.
Murray, C. B., Et al. *J. Am. Chem. Soc.* 1993, 115, 8706.
Nakamura T., Et al., Optical Review, vol. 11, p. 370-377, 2004.
Nakamura T., Et al., *J. Appl. Phys.* 2005, 97, 054505.
Nakamura T., Et al., J. Appl. Phys., vol. 96, No. 11, Dec. 1, 2004.
Olsson Y. K., Et al., "Fabrication and optical properties of polymeric waveguides containing nanocrystalline quantum dots", Applied Physics Letter, 18 4469 (2004).
Pang, et al. Optics Express, Jan. 10, 2005 vol. 13, No. 1.
Patel N. K., Et al., *IEEE J. Sel. Top. Quantum Electron.* 2002, 8, 346.
PCT International Report on Patentability, dated Sep. 9, 2008, for PCT/US2007/005589.
PCT International Report on Patentability, dated Sep. 9, 2008, for PCT/US2008/08822.
PCT International Report on Patentability, dated Sep. 11, 2008, for PCT/US2008/07902.
PCT International Report on Patentability, dated Jan. 26, 2010, for PCT/US2008/08924.
Peng H.J., Et al., Journal of Applied Physics vol. 96, No. 3, Aug. 1, 2004.
Peng H. J., Et al., *SID Int. Symp. Digest Tech. Papers* 2003, 34, 516.
Ran G.Z., El al., J. Opt. Pure Appl. Opt. 8 (2006).
Rohwer, et al. Proc. Of SPIE vol. 5366 (2004).
Segal M., El al., Nature Materials. 6. 374-378 (2007).
Segal M., Et al., Physical Review B. 68. 075211 (2003).
Shiang J.J., Et al., J. Appl, Phys., vol. 95, No. 5, Mar. 1, 2004.
Song, et al, Nanotechnology 18 (2007), 055402.
Steckel J. S., Et al., "Monolayers and Multilayers of [Mn12O12(O2CMe)16]", Nano Letters, 4, 399 (2004).
Steckel J. S., Et al., "1.3 μm to 1.55 μm Tunable Electroluminescence from PbSe Quantum Dots Embedded within an Organic Device", Adv. Mater., 15, 1862 (2003).
Steckel J. S., Et al., "On the Mechanism of Lead Chalcogenide Nanocrystal Formation", Journal of the American Chemical Society, 128, 13032 (2006).
Steckel, J. S., Et al., "Color Saturated Green-Emitting QD-LEDs", Angewandte Chemie International Edition, 45, 5796 (2006).
Steckel, J. S., Et al., "Blue Luminescence from (CdS)ZnS Core-Shell Nanocrystale", Angewandte Chemie International Edition, 43, 2154 (2004).
Sun Y., Et al., J. Appl. Phys. 100, 073106 (2006).
Tang, C. W., Et al. *Appl. Phys. Lett.* 1987, 51, 913.
Thoma, et al., Proc. Of SPIE vol. 5276 (2004), pp. 202 et seq.
Tsutsui T., Et al., *Adv. Mater.* 2001, 13, 1149.
Tsutsui T., Et al., *Trans. R. Soc. London A* 1997, 355, 801.
Tsutsui T., Et al, *Jpn. J. Appl. Phys.*, Part 2 1999, 38, L1502.).
Weller, H., Quantized Semiconductor Particles: "A Novel Stale of Matter for Materials Science" Adv. Mater. 1993. 5. No. 2, pp. 88-95.
Yamasaki T., Et al, *App. Phys. Lett.* 2000, 76, 1243.
Yanagida, S. Et al., "Preparation of Quantized-CdS Doped Poly(Methyl Methacrylate) Films, Optical and Morphological Properties", Chem. Lett., pp. 1773-1776, 1990.
Yang, et al. J. Mater. Chem., 1897, 7 (1), 131-133.
Yokogawa H., Et al., *SID Int. Symp. Digest Tech. Papers* 2001, 32, 405.
Ziegler, et al. Adv. Mater. 2008, 20, 4068-4073.

* cited by examiner

QUANTUM DOT LIGHT ENHANCEMENT SUBSTRATE AND LIGHTING DEVICE INCLUDING SAME This application is a continuation application of commonly owned International Application No. PCT/US2008/008924, filed 23 Jul. 2008, which was published in the English language as PCT Publication No. WO 2009/014707 on 29 Jan. 2009. PCT Application No. PCT/US2008/008924 claims priority to U.S. Application No. 60/951,427, filed Jul. 23, 2007 and U.S. Application No. 61/074,028, filed 19 Jun. 2008. Each of the foregoing applications is hereby incorporated herein by reference in its entirety.

TECHNICAL FIELD OF THE INVENTION

The present invention relates to the technical fields of films including quantum dots (QDs); components including quantum dots, which are useful for lighting applications; and devices including the foregoing.

SUMMARY OF THE INVENTION

In accordance with one embodiment of the present invention, there is provided a component comprising a substrate comprising a material that is transparent to light within a predetermined range of wavelengths, a color conversion material comprising quantum dots disposed over a predetermined region of a surface of the substrate, and a conductive material disposed over at least a portion of the color conversion material, the conductive material being transparent to light within a second predetermined range of wavelengths.

In certain embodiments, a component can include a substrate comprising a material that is transparent to light within a predetermined range of wavelengths, a layer comprising a predetermined arrangement of features disposed over a predetermined region of a surface of the substrate, wherein at least a portion of the features comprise a color conversion material comprising quantum dots, and a conductive material disposed over at least a portion of the layer, the conductive material being transparent to light within a second predetermined range of wavelengths.

In certain embodiments, features including color conversion material are disposed in a dithered arrangement.

In certain embodiments, a component can include a substrate comprising a material that is transparent to light within a predetermined range of wavelengths, a layered arrangement including two or more layers disposed over a predetermined region of a surface of the substrate, wherein each of the layers comprises a color conversion material comprising quantum dots capable of emitting light having a predetermined wavelength that is distinct from that emitted by quantum dots included in one or more of the other layers, and conductive material disposed over at least a portion of the layered arrangement, the conductive material being transparent to light within a second predetermined range of wavelengths.

In certain embodiments, one or more outcoupling features disposed on a surface of the substrate opposite the color conversion material.

In accordance with other embodiments of the present invention, there are provided lighting devices including components described herein.

In accordance with another embodiment of the present invention, there is provided a film comprising a layer comprising a color conversion material comprising quantum dots and conductive material disposed over at least a portion of the layer.

In certain embodiments, a film comprises a conductive material and a plurality of features comprising a color conversion material disposed over at least a portion of the conductive material, wherein the color conversion material comprises quantum dots and wherein the color conversion material included in each of the features includes quantum dots capable of emitting light having a predetermined wavelength such that the film is capable of emitting light of a preselected color when optically coupled to a source of light emission. In certain embodiments, a preselected color of white is desirable.

In certain embodiments, a film comprises a layered arrangement of two or more films comprising color conversion material, wherein color conversion material includes quantum dots and wherein the color conversion material included in each film is selected to include quantum dots capable of emitting light having a predetermined wavelength such that the layered arrangement is capable of emitting light of a preselected color when optically coupled to a source of light emission. In certain embodiments, films are arranged in order of decreasing or increasing wavelength.

In accordance with other embodiments of the present invention, there are provided components including films described herein.

In accordance with other embodiments of the present invention, there are provided lighting devices including films described herein.

In accordance with another embodiments of the of the present invention, there is provided a lighting device including a component comprising a substrate comprising a material that is transparent to light within a predetermined range of wavelengths, a color conversion material comprising quantum dots disposed over a predetermined region of a surface of the substrate, and a conductive material disposed over at least a portion of the color conversion material, the conductive material being transparent to light within a second predetermined range of wavelengths, the conductive material forming a first electrode of the device; an emissive layer disposed over at least a portion of the conductive material, wherein the emissive layer comprises a material capable of emitting light; and a second electrode disposed over the emissive layer.

In various embodiments described herein, reference to light within a predetermined range of wavelengths includes light with a predetermined wavelength.

Quantum dots comprising semiconductor nanocrystals are preferred for use in the present inventions.

The foregoing, and other aspects and embodiments described herein and contemplated by this disclosure all constitute embodiments of the present invention.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

Figure 1A:
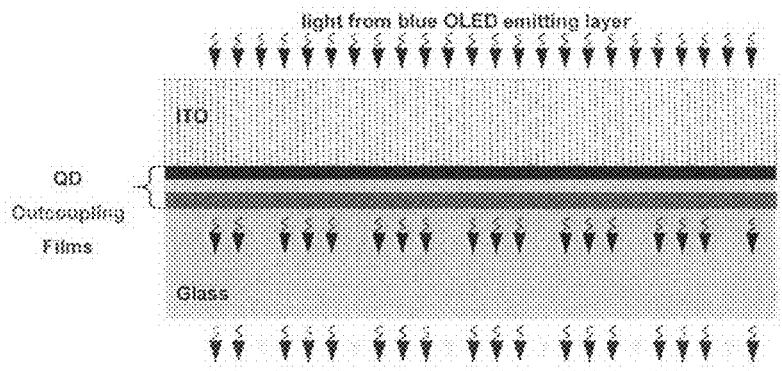
FIGS. 1(a) and (b) schematically depict examples of embodiments of a component in accordance with the present invention.

The attached figures are simplified representations presented for purposes of illustration only; the actual structures may differ in numerous respects, particularly including the relative scale of the articles depicted and aspects thereof.

For a better understanding to the present invention, together with other advantages and capabilities thereof, reference is made to the following disclosure and appended claims in connection with the above-described drawings.

DETAILED DESCRIPTION OF THE INVENTION

In accordance with one embodiment of the invention, there is provided a film comprising a layer comprising a color conversion material comprising quantum dots and conductive material disposed over at least a portion of the layer.

In certain embodiments, the quantum dots comprise semiconductor nanocrystals.

In certain embodiments, a film comprises a conductive material and a plurality of features comprising a color conversion material disposed over at least a portion of the conductive material, wherein the color conversion material comprises quantum dots and wherein the color conversion material included in each of the features is selected to include quantum dots capable of emitting light having a predetermined wavelength such that the film is capable of emitting light of a preselected color when optically coupled to a source of light emission.

In certain embodiments, the preselected color is white.

In certain embodiments, film comprises a layered arrangement of two or more layers comprising color conversion material, wherein color conversion material includes quantum dots and wherein the color conversion material included in each layer is selected to include quantum dots capable of emitting light having a predetermined wavelength such that the film is capable of emitting light of a preselected color when optically coupled to source of light emission. In certain embodiments, layers are arranged in order of decreasing or increasing wavelength.

In accordance with another embodiment of the present invention, there is provided a component comprising a substrate comprising a material that is transparent to light within a predetermined range of wavelengths, a color conversion material comprising quantum dots disposed over a predetermined region of a surface of the substrate, and a conductive material disposed over at least a portion of the color conversion material, the conductive material being transparent to light within a second predetermined range of wavelengths.

In certain embodiments, the quantum dots comprise semiconductor nanocrystals.

In certain embodiments, the component includes two or more layers comprising color conversion material, wherein each layer comprises a color conversion material comprising quantum dots that are capable of emitting light having a predetermined wavelength that is distinct from light that can be emitted by quantum dots included in at least one of the other layers.

In certain embodiments, a component comprises a substrate comprising a material that is transparent to light within a predetermined range of wavelengths, a layer comprising a predetermined arrangement of features disposed over a predetermined region of a surface of the substrate, wherein at least a portion of the features comprise a color conversion material comprising quantum dots, and a conductive material disposed over at least a portion of the layer, the conductive material being transparent to light within a second predetermined range of wavelengths.

In certain preferred embodiments, the predetermined arrangement comprises a dithered arrangement.

In certain embodiments, the predetermined arrangement includes features comprising color conversion material and features comprising material with a refractive index that is not the same as that of the color conversion material.

In certain embodiments, the predetermined arrangement includes features comprising color conversion material and features comprising material with outcoupling capability.

In certain embodiments, the predetermined arrangement includes features comprising color conversion material and features comprising material with outcoupling and non-scattering capability.

In certain embodiments, features comprising color conversion material are arranged in a dithered arrangement and wherein color conversion material included in each of the features is selected to include quantum dots capable of emitting light having a predetermined wavelength such that the component is capable of emitting white light when integrated into a light source.

In certain embodiments, at least a portion of the features including color conversion material are optically isolated from other features including color conversion material.

In certain embodiments, at least a portion of the features including color conversion material are optically isolated from other features including color conversion material by air. For example, the features may be spaced apart from each other. In certain embodiments, the spacing can be on a scale of millimeters to nanometers.

In certain embodiments, at least a portion of the features including color conversion material are optically isolated from other features including color conversion material by a lower or higher refractive index material.

In certain embodiments, reflective material is included in spaces between at least a portion of the features including color conversion material.

In certain embodiments, the predetermined arrangement comprises features including color conversion material, features comprising reflective material, and features comprising scatterers.

In certain embodiments, a component comprises a substrate comprising a material that is transparent to light within a predetermined range of wavelengths, a layered arrangement including two or more layers disposed over a predetermined region of a surface of the substrate, wherein each of the layers comprises a color conversion material comprising quantum dots capable of emitting light having a predetermined wavelength that is distinct from that emitted by quantum dots included in one or more of the other layers, and conductive material disposed over at least a portion of the layered arrangement, the conductive material being transparent to light within a second predetermined range of wavelengths, and one or more outcoupling features disposed on a surface of the substrate opposite the color conversion material.

In certain embodiments, a substrate comprises a waveguide.

In certain embodiments, a substrate is flexible.

In certain embodiments, a substrate is rigid.

In certain embodiments, a component further includes a thin film interference filter between the substrate and color conversion material. Such filter can be useful to recycle unconverted light back into the color conversion material and to remove undesired light from light emitted from the component or device including same.

In certain embodiments, a component further includes one or more outcoupling features disposed on a surface of the substrate opposite the color conversion material.

In certain embodiments, an outcoupling feature comprises a microlens.

In certain embodiments, an outcoupling feature comprises a micro-relief structure.

In certain embodiments, the component further includes an array of outcoupling features on a surface of the substrate opposite the color conversion material.

In certain embodiments, at least a portion of the outcoupling features are configured to have predetermined outcoupling angles.

In certain embodiments, at least a portion of the outcoupling features include a substantially hemispherical surface.

In certain embodiments, at least a portion of the outcoupling features include a curved surface.

In certain embodiments, at least a portion of the features are printed.

In certain embodiments, features can be printed by screen-printing, contract printing, or inkjet printing.

In certain embodiments of films, components, and devices described herein, color conversion material further comprises a host material in which the quantum dots are dispersed. A non-limiting list of examples of host materials are described below.

In certain embodiments, color conversion material further comprises a binder in which the quantum dots are dispersed.

In certain embodiments, color conversion material has an index of refraction greater than or equal to the index of refraction of the conductive material.

In certain embodiments, the host material is transparent to light in the predetermined range of wavelengths and light in the second predetermined range of wavelengths. For example, in certain embodiments, the host material is preferably at least 70%, more preferably at least 80%, and most preferably at least 90%, transparent to light to be color converted by the quantum dots. In certain embodiments, the host material is preferably at least 70%, more preferably at least 80%, and most preferably at least 90%, transparent and light emitted by the quantum dots.

A host material can be an organic material or an inorganic material. As mentioned above, non-limiting examples of host materials are provided herein.

In certain embodiments, a host material has an index of refraction greater than or equal to the index of refraction of the conductive material.

In embodiments described herein including more than one color conversion materials, one or more of such materials can further include a host material. When more than one color conversion material including a host material is used, the host material in each can be the same host material. In certain embodiments, different host material can be included in one or more of the different color conversion materials.

In certain embodiments, color conversion materials can further includes scatterers.

In certain embodiments, light emitted from the surface of the component is substantially uniform across a predetermined region of the substrate surface. In certain embodiments, white light is emitted.

In certain embodiments, a reflective material is included on the edges of the substrate.

In certain embodiments, a reflective material is included around at least a portion of the edges of the substrate.

Examples of reflective materials include silver and alumina. Other reflective materials can be used.

In certain embodiments including one or more layers comprising color conversion material, each layer is capable of emitting light at a wavelength that is distinct from that of any of the other layers.

In certain embodiments including one or more layers including different color conversion materials in a layered arrangement, the layers are arranged in order of decreasing wavelength from the conductive material, with the film capable of emitting light at the highest wavelength being closest to the conductive material and the film capable of emitting light at the lowest wavelength being farthest from the conductive material.

In certain embodiments including a predetermined arrangement of features including color conversion materials, the light-emitting characteristics of the quantum dots included in color conversion materials included in the features can be selected based on the preselected light output desired.

In certain embodiments, for example, a first portion of the features includes quantum dots capable of emitting red light, a second portion of the features includes quantum dots capable of emitting orange light, a third portion of the features includes quantum dots capable of emitting yellow light, a fourth portion of the features includes quantum dots capable of emitting green light, and a fifth portion of the features includes quantum dots capable of emitting blue light In another example, a first portion of the features includes quantum dots capable of emitting red light, a second portion of the features includes quantum dots capable of emitting orange light, a third portion of the features includes quantum dots capable of emitting yellow light, a fourth portion of the features includes quantum dots capable of emitting green light, and a fifth portion of the features includes optically transparent scatterers or non-scattering material.

In another example, a first portion of the features includes quantum dots capable of emitting blue light, a second portion of the features includes quantum dots capable of emitting green light, a third portion of the features includes quantum dots capable of emitting yellow light, and a fourth portion of the features includes quantum dots capable of emitting red light.

In another example, a first portion of the features includes optically transparent scatterers or non-scattering material, a second portion of the features includes quantum dots capable of emitting green light, a third portion of the features includes quantum dots capable of emitting yellow light, and a fourth portion of the features includes quantum dots capable of emitting red light.

In a further example, a first portion of the features includes quantum dots capable of emitting red light, a second portion of the features includes quantum dots capable of emitting green light, and a third portion of the features includes quantum dots capable of emitting blue light.

In still another example, a first portion of the features includes optically transparent scatterers or non-scattering material, a second portion of the features includes quantum dots capable of emitting red light, and a third portion of the features includes quantum dots capable of emitting green light.

In yet another example, a first portion of the features includes quantum dots capable of emitting blue light, and a second portion of the features includes quantum dots capable of emitting yellow light.

In a still further example, a first portion of the features includes optically transparent scatterers or non-scattering material, and a second portion of the features include quantum dots capable of emitting yellow light.

Other color conversion materials in other arrangements can also be used based on the light output desired and the color of the excitation light for the quantum dots. For example, in the foregoing examples, arrangements including blue quantum dots can be used with an ultraviolet light source to provide a blue component of light in light emitted from a film, component, or device including such arrangement of features. In the foregoing examples, arrangements including scatterers and/or nonscattering materials and not blue quantum dots can be used with a blue light source, the blue source light providing the blue component of light emitted from a film, component, or device including such arrangement of features.

In certain embodiments including a layered arrangement of films including color conversion materials, the composition of, and number of, films can be selected based on the preselected light output desired and the excitation light source.

In certain embodiments, for example, a layered arrangement includes a first film including quantum dots capable of emitting red light, a second film including quantum dots capable of emitting orange light, a third film including quantum dots capable of emitting yellow light, a fourth film including quantum dots capable of emitting green light, and a fifth film including quantum dots capable of emitting blue light.

In another example, a layered arrangement includes a first film including quantum dots capable of emitting red light, a second film including quantum dots capable of emitting orange light, a third film including quantum dots capable of emitting yellow light, a fourth film including quantum dots capable of emitting green light, and a fifth film including scatterers or non-scattering material to outcouple light.

In another example, a layered arrangement includes a first film including quantum dots capable of emitting blue light, a second film including quantum dots capable of emitting green light, a third film including quantum dots capable of emitting yellow light, and a fourth film including quantum dots capable of emitting red light.

In still another example, a layered arrangement includes a first film including optically transparent scatterers or non-scattering material, a second film including quantum dots capable of emitting green light, a third film including quantum dots capable of emitting yellow light, and a fourth film including quantum dots capable of emitting red light.

In a further example, a layered arrangement includes a first film including quantum dots capable of emitting red light, a second film including quantum dots capable of emitting green light, and a third film including quantum dots capable of emitting blue light.

In a still further example, a layered arrangement includes a first film including quantum dots capable of emitting red light, a second film including quantum dots capable of emitting green light, and a third film including scatterers or non-scattering material to outcouple light.

In yet another example, a layered arrangement includes a first film including quantum dots capable of emitting blue light, a second film including quantum dots capable of emitting yellow light.

In yet another example, a layered arrangement includes a first film including quantum dots capable of emitting yellow light, a second film including scatterers or non-scattering material to outcouple light.

Other color conversion materials in other layered arrangements can also be used based on the light output desired and the color of the excitation light for the quantum dots. For example, in the foregoing examples, arrangements including blue quantum dots can be used with an ultraviolet light source to provide a blue component of light in light emitted from a film, component, or device including such arrangement of features. In the foregoing examples, arrangements including scatterers and/or nonscattering materials and not blue quantum dots can be used with a blue light source, the blue source light providing a blue component of light in light emitted from a film, component, or device including such arrangement of features.

In accordance with other embodiments of the present invention, there are provided components including one or more films described herein.

In accordance with other embodiments of the present invention, there are provided lighting devices including one or more of the films and/or components described herein.

In certain embodiments, in a lighting device including a component described herein, the conductive material can act as an electrode of the device.

Solid state lighting devices, including thin film light emitting devices such as OLEDs, quantum dot light emitting devices, thin film electroluminescent devices, are known in the art. The films and components described herein are useful for improving these solid state lighting devices.

In certain embodiments, a lighting device includes a component comprising a substrate comprising a material that is transparent to light within a predetermined range of wavelengths, a color conversion material comprising quantum dots disposed over a predetermined region of a surface of the substrate, and a conductive material disposed over at least a portion of the color conversion material, the conductive material being transparent to light within a second predetermined range of wavelengths, the conductive material forming a first electrode of the device; an emissive layer disposed over at least a portion of the conductive material, wherein the emissive layer comprises a material capable of emitting light; and a second electrode disposed over the emissive layer.

In certain embodiments, a lighting device includes a component comprising a substrate comprising a material that is transparent to light within a predetermined range of wavelengths, a layer comprising a predetermined arrangement of features disposed over a predetermined region of a surface of the substrate, wherein at least a portion of the features comprise a color conversion material comprising quantum dots, and a conductive material disposed over at least a portion of the layer, the conductive material being transparent to light within a second predetermined range of wavelengths, the conductive material forming a first electrode of the device; an emissive layer disposed over at least a portion of the conductive material, wherein the emissive layer comprises a material capable of emitting light; and a second electrode disposed over the emissive layer.

In certain embodiments, a lighting device includes a component comprising a substrate comprising a material that is transparent to light within a predetermined range of wavelengths, a layered arrangement including two or more layers disposed over a predetermined region of a surface of the substrate, wherein each of the layers comprises a color conversion material comprising quantum dots capable of emitting light having a predetermined wavelength that is distinct from that emitted by quantum dots included each of the other layers, and electrode material disposed over at least a portion of the layered arrangement, the conductive material being transparent to light within a second predetermined range of wavelengths, the conductive material forming a first electrode of the device; an emissive layer disposed over at least a portion of the conductive material, wherein the emissive layer comprises a material capable of emitting light; and a second electrode disposed over the emissive layer.

In such embodiments, a device can further include one or more charge transport layers between the electrodes.

In such embodiments, a device can further include one or more charge injection layers between the electrodes.

In certain of such embodiments, an emissive layer can comprise quantum dots.

In certain of such embodiments, an emissive layer can comprise an organic electroluminescent material.

In certain of such embodiments, an emissive layer can comprise an electroluminescent phosphor.

In certain embodiments, a substrate included in component included in a lighting device further includes one or more outcoupling features on a surface of the substrate opposite the color conversion material.

In certain embodiments, the emissive layer included in a device is capable of emitting blue light.

In certain embodiments, the emissive layer included in a device is capable of emitting ultraviolet light.

In certain embodiments, the emissive layer included in a device is capable of emitting light with a predetermined wavelength.

In certain embodiments, composition and arrangement of color conversion materials included in a component included in a lighting device is preselected for achieving the desired light output from the device. Non-limiting examples are described above.

In certain embodiments, a film, device, and component described herein can further include a UV filter to remove UV light from light emitted from the device from which UV emission could occur.

In certain embodiments of films, devices, and/or components described herein including a layered arrangement including two or more films including color conversion material, the films are arranged in order of decreasing wavelength. Preferably, the film capable of emitting light at the highest wavelength being closest to the conductive material and the film capable of emitting light at the lowest wavelength being farthest from the conductive material.

In certain embodiments of films, devices, and/or components described herein, the color conversion material can absorb at least 70%, more preferably, at least 80%, and most preferably, at least 90%, of light to be color converted.

In certain embodiments, a color conversion material includes quantum dots without a host material. In certain of such embodiments, color conversion material preferably has a thickness of less than about 10 microns, and more preferably less than one micron.

In certain embodiments, a color conversion material includes quantum dots distributed in a host material. In certain of such embodiments, for example, including about 2-3 weight percent quantum dots based on the weight of the host material, color conversion material preferably has a thickness of less than about 100 microns, and more preferably less than 70 microns. In certain embodiments, the thickness can be in a range from about 40-70 or 50-60 microns.

Concentrations, thickness, and configurations, etc. will vary based on the materials used, performance criteria, and other design choices.

In certain embodiments including a host material, the host material preferably has an index of refraction greater than or equal to that of the conductive material being used.

In certain embodiments of films, components, and devices described herein including features including color conversion material, a feature can be submicron (e.g., less than 1 micron). In certain embodiments, a feature can have a size in the range from about 100 nm to about 1 micron. Other sized may also be desired based on the application and desired light effect.

In certain embodiments of films, components, and devices described herein, the conductive material is disposed in a second predetermined arrangement. For example, in certain embodiments a conductive material can be patterned or unpatterned. In patterned embodiments, a feature of the pattern can have a size less than or equal to about 10 cm, less than or equal to about 1 cm, less than or equal to about 1 mm, less than or equal to about 100 microns. Other size features can also be used. An unpatterned area of conductive material and a feature of patterned conductive material may be referred to for purposes of this discussion as a pixel. In certain embodiments, the size of the features comprising color conversion material can be submicron, which can be significantly smaller than the size of the features of the conductive material. This can permit dithering of features of color conversion material within the area of a corresponding pixel of conductive material.

As discussed above, in certain embodiments, a component includes a substrate, at least one layer including a color conversion material comprising quantum dots disposed over the substrate, and a layer comprising a conductive material (e.g., indium-tin-oxide) disposed over the at least one layer. (Such component is also referred to herein as a QD light-enhancement substrate (QD-LES).) In certain preferred embodiments, the substrate is transparent to light, for example, visible light, ultraviolet light, and/or infrared radiation. In certain embodiments, the substrate is flexible. In certain embodiments, the substrate includes an outcoupling element. In certain embodiments, the substrate includes a microlens array. In certain embodiments, the substrate has a microlens array on the light-emitting surface thereof. In certain embodiments, the at least one layer comprising quantum dots is patterned. In certain embodiments, the at least one layer comprising quantum dots is unpatterned. In certain preferred embodiments, the at least one layer comprises a solution-processable quantum dots.

In accordance with another aspect of the present invention, there is provided a light emitting device including a component described herein. In certain embodiments, the component includes at least one layer including quantum dots (QDs). In certain embodiments, the at least one layer comprising quantum dots is patterned. In certain embodiments, the at least one layer comprising quantum dots is unpatterned. In certain preferred embodiments, the at least one layer comprises a solution-processable quantum dots. In certain embodiments, the light emitting device includes a substrate comprising at least one layer comprising quantum dots disposed over the substrate, and a layer comprising indium-tin-oxide (ITO) disposed over the at least one layer. In certain embodiments, the substrate is flexible. In certain embodiments, the substrate includes an outcoupling element. In certain embodiments, the substrate includes a microlens array. In certain embodiments, the substrate has a microlens array on the light-emitting surface thereof. In certain preferred embodiments, the substrate is transparent to light, for example, visible light, ultraviolet light, and/or infrared radiation. In certain embodiments, the light emitting device comprises an organic light emitting device (OLED). In certain embodiments comprising an OLED, the OLED can achieve efficient and stable color rendering index (CRI), which can be desirable for various solid state lighting applications. In certain embodiments, the at least one layer including quantum dots is capable of generating tunable white emission from a light emitting device that emits blue light (see FIG. 1(a) for an example of one embodiment), including, but not limited to an OLED. FIG. 1(a) schematically depicts an example of an embodiment of a quantum dot light enhancement substrate (QD-LES) incorporating films comprising quantum dots capable of emitting light having a wavelength distinct from that emitted by quantum dots in other films. In certain embodiments, the quantum dots are dispersed in a host material. Preferably the host material has a refractive index greater than or equal to that of the conductive material. The quantum dot containing films are disposed between a transparent conductive or electrode material (e.g., an ITO film; ITO has a refractive index of 1.8) and a base material comprising, for example, glass or other material with desired transparency.

In certain embodiments, moisture and oxygen getters or desiccant can be included in a film, component, or device included herein.

In certain embodiments, a protective environmental coating may also be applied to the emitting face of a film, component, or device to protect the color conversion material from the environment.

In the example of the embodiment depicted in FIG. 1(a), the layer comprising quantum dot (QD) integrated into ITO-glass substrates can alter the emission from, e.g., a blue emitting phosphorescent OLED (Ph-OLED) device, and outcouple light from the ITO film.

Figure 1B:
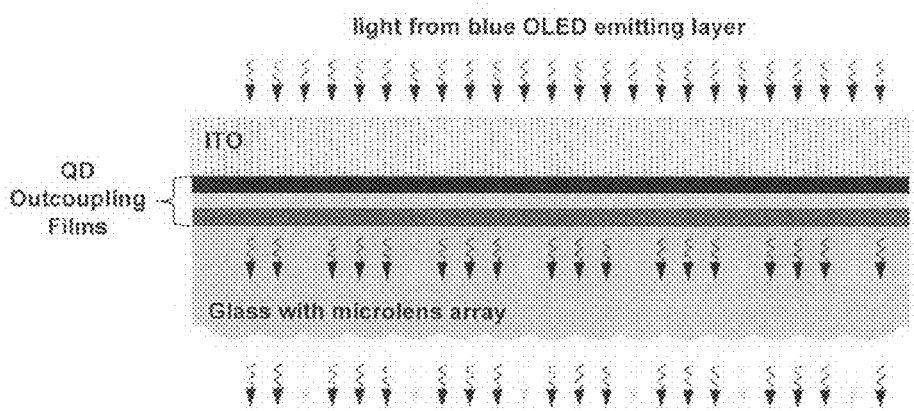

In certain embodiments, an outcoupling element is further included in or on the external surface of the substrate. A preferred example of an outcoupling element comprises a microlens array. An example of an embodiment including a substrate including a microlens array is illustrated in FIG. 1(b). In the example depicted in FIG. 1(b), a quantum dot light enhancement substrate (QD-LES) includes films comprising quantum dots capable of emitting light having a wavelength distinct from that emitted by quantum dots in other films. In certain embodiments, the quantum dots are dispersed in a host material. Preferably the host material has a refractive index greater than or equal to that of the conductive material. The quantum dot containing films are disposed between a transparent electrode (e.g., an ITO film) and a base material comprising, for example, glass or other material with desired transparency. A microlens array is also included to improve outcoupling of light.

(While the examples of embodiments shown in FIGS. 1(a) and (b) depict bottom-emitting OLED structures on glass substrates, in other embodiments, in other embodiments, the substrate can be flexible and/or the OLED structure can be top-emitting OLED.).

In the examples depicted in FIG. 1, three films including quantum dots are included in the component. In certain embodiments, fewer films can be included. In certain embodiments, more than three films can be included. The number of films is a design choice based on the predetermined spectral output desired from the component.

In certain embodiments comprising an OLED, the substrate including quantum dots will simultaneously increase OLED light out-coupling while preferably providing >85 CRI white light, more preferably >90 CRI, and most preferably >95, white light, that is readily tunable and inherently stable for any diffuse lighting application.

Figure 2:
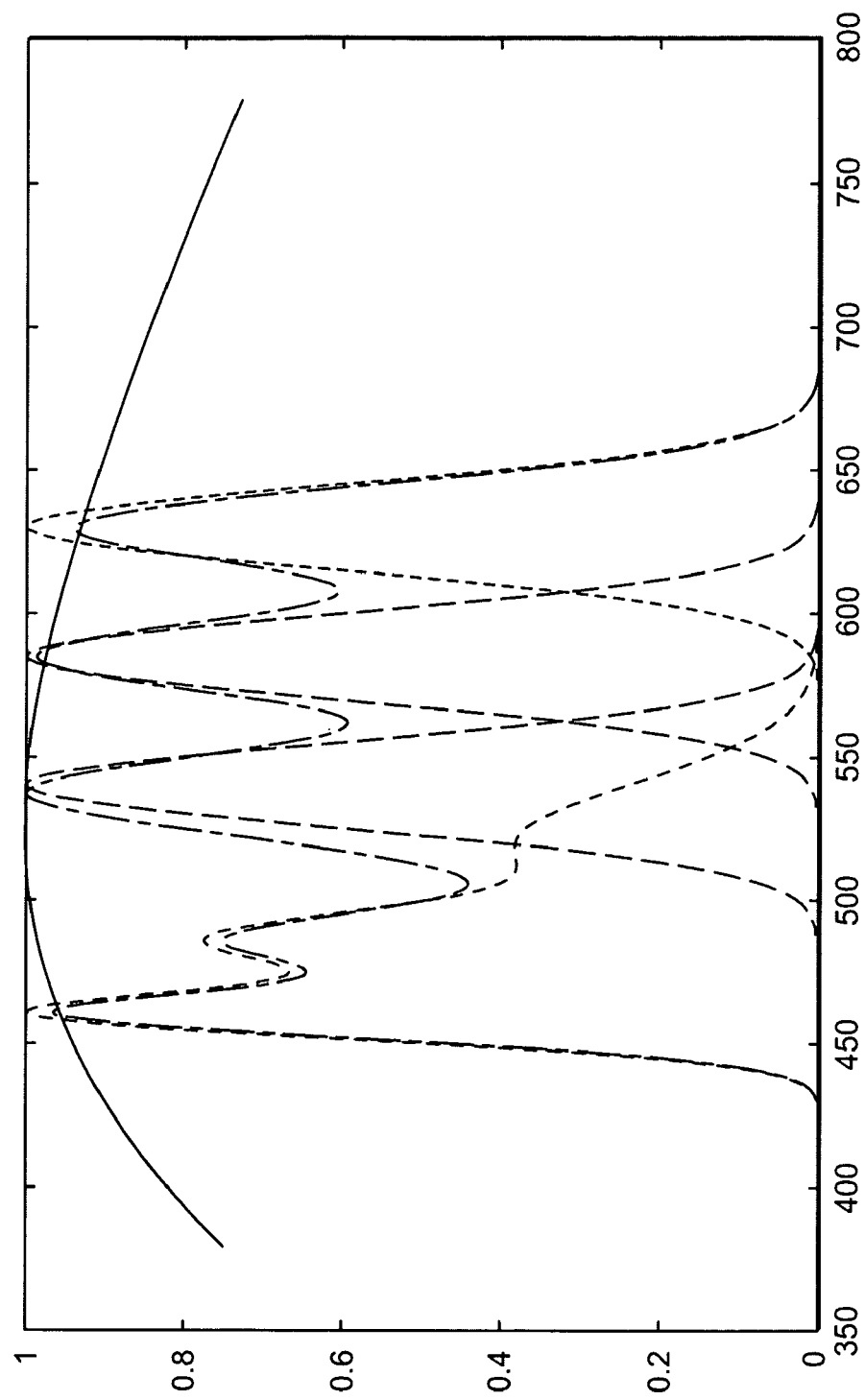
FIG. 2 illustrates simulated spectra of an example of an embodiment of a light-emitting device that includes a blue Ph-OLED (flr6) and three films including color conversion materials, each of which includes quantum dots capable of emitting light having a predetermined wavelength.

In certain embodiments comprising an OLED, OLED external quantum efficiencies can be improved by potentially more than 100% while producing high CRI white light with enhanced stability performance over a wide range of intensities. In certain embodiments, as shown in FIG. 2, a CRI>95 white light with unprecedented color stability performance over a wide range of intensities may be achieved. FIG. 2 provides a simulated spectra of a CRI=86 QD-LES (including three films including quantum dots) optically coupled to a blue Ph-OLED (flr6). The simulation is based in inclusion of a red-emitting film, a yellow-emitting film, and a green-emitting film. A 5500K black body radiation curve is also plotted for reference.

In certain embodiments, a film or layer comprising quantum dot is directly applied to a substrate by solution processing techniques. Preferably, the refractive index of the film or layer comprising quantum dots is greater than the refractive index of the substrate over which the film or layer is disposed and is greater than the refractive index of the layer of conductive material (e.g., indium-tin-oxide (ITO)) which is disposed over the film or layer comprising quantum dots. Preferably, the inclusion of the film or layer comprising quantum dots between the substrate and the conductive layer (e.g., ITO) can provide unprecedented increases in light extraction efficiencies when included in an OLED along with stable, high (preferably >85, more preferably >90, most preferably >95) CRI white light.

Since the publication of multilayered organic electroluminescent (EL) devices in 1987 (C. W. Tang, S. A. VanSlyke, *Appl. Phys. Lett.* 1987, 51, 913), the development of OLED materials and device architectures has driven continuous advancements in EL device efficiencies. In fact, when Baldo et. al. introduced the use of phosphorescent emitters (M. A. Baldo, S. Lamansky, P. E. Burrows, M. E. Thompson, and S. R. Forrest, *Appl. Phys. Lett.* 1999, 75, 4. T. Tsutsui et al, *Jpn. J. Appl. Phys., Part* 2 1999, 38, L1502.)

Ph-OLED devices were shown to operate with nearly 100% internal quantum efficiencies. However, only a fraction of the total photons generated in these devices are usefully extracted because of the total internal reflection (TIR) and wave-guiding effects of the high-index layers comprising the device and anode. The loss mechanism is associated with the absorption of the reflected and wave-guided photons by the metal electrode, the organic layers themselves, and the indium tin oxide (ITO) electrode. Consequently, the measured external quantum efficiencies of these devices are typically only ~20% of the internal efficiency (T. Tsutsui, E. Aminaka, C. P. Lin, D.-U. Kim, *Philos. Trans. R. Soc. London A* 1997, 355, 801, N. K. Patel, S. Cina, J. H. Burroughes, *IEEE J. Sel. Top. Quantum Electron.* 2002, 8, 346)

While many methods have been proposed and attempted to increase the light out-coupling efficiency within an OLED device structure, considerable improvements are still needed to enable OLEDs to achieve the performance and cost needed to enter the solid state lighting (SSL) market.

While increases in extraction efficiency have been realized, considerable room for improvement remains.

In accordance with certain preferred embodiments of the invention, a planar, composite material including quantum dots dispersed therein is included in a substrate for a blue-emitting ph-OLED. In certain embodiments, the composite material including quantum dots has a refractive index that is at least 0.1 higher, preferably at least 0.2 higher, more preferably at least 0.3 higher than the substrate. In certain embodiments further including a layer of ITO disposed over the one or more layers including quantum dots, the index of refraction of the composite including quantum dots is also at least 0.1 higher, preferably at least 0.2 higher, more preferably at least 0.3 higher than the ITO layer. The composite material including quantum dots dispersed therein is capable of down-converting a precisely tailored portion of the blue light emitted by the ph-OLED to create white light, most preferably with a high CRI (e.g., at least 85, at least 90, at least 95), while out-coupling light typically lost at an interface between ITO and the substrate on which it is deposited. Optical modes within the OLED will preferentially propagate within one or more layers or films including quantum dots by tailoring the refractive index and thickness of the composite. In certain preferred embodiments, appropriate scattering materials are further included within the composite. Such scatterers can enhance light extraction from the device. Additional information that may be useful for the present inventions is described in U.S. Patent Application Nos. 60/946,090, entitled "Methods For Depositing Nanomaterial, Methods for Fabricating A Device, Methods For Fabricating An Array Of Devices and Compositions, of Linton, et al., filed Jun. 25, 2007; 60/949,306, entitled "Methods For Depositing Nanomaterial, Methods for Fabricating A Device, Methods For Fabricating An Array Of Devices and Compositions, of Linton, et al., filed Jul. 12, 2007; 60/971,885, entitled "Optical Component, System Including an Optical Components, Devices, and Composition", of Coe-Sullivan, et al., filed Sep. 12, 2007; 60/973,644, entitled "Optical Component, System Including an Optical Components, Devices, and Composition", of Coe-Sullivan, et al., filed Sep. 19, 2007; and 61/016,227, entitled "Compositions, Optical Component, System Including an Optical Components, and Devices", of Coe-Sullivan, et al., filed Dec. 221, 2007; each of the foregoing being hereby incorporated herein by reference in its entirety. This innovative solution will simultaneously increase light-extraction efficiency and generate tunable, high CR1, white light via multiple narrow band QD emitters.

In certain embodiments, a layer comprising color conversion material including quantum dots (e.g., a quantum dot-light enhancement film (QD-LEF)) can further include scatterers. In certain embodiments, the scatterers can be included in the color conversion material. In certain embodiments, the scatterers can be included in a separate layer. In certain embodiments, a film or layer including a color conversion material can be disposed in a predetermined arrangement including features wherein a portion of the features includes scatterers but do not include color conversion material. In such embodiments, the features including color conversion material can optionally also include scatterers.

Examples of scatterers (also referred to as light scattering particles) that can be used in the embodiments and aspects of the inventions contemplated by this disclosure, include, without limitation, metal or metal oxide particles, air bubbles, and glass and polymeric beads (solid or hollow). Other scatterers can be readily identified by those of ordinary skill in the art. In certain embodiments, scatterers have a spherical shape. Preferred examples of scattering particles include, but are not limited to, $TiO_2$, $SiO_2$, $BaTiO_3$, $BaSO_4$, and ZnO. Particles of other materials that are non-reactive with the host material and that can increase the absorption pathlength of the excitation light in the host material can be used. Additionally, scatterers that aid in the out-coupling of the down-converted light may be used. These may or may not be the same scatterers used for increasing the absorption pathlength. In certain embodiments, the scatterers may have a high index of refraction (e.g., $TiO_2$, $BaSO_4$, etc) or a low index of refraction (gas bubbles). Preferably the scatterers are not luminescent.

Selection of the size and size distribution of the scatterers is readily determinable by those of ordinary skill in the art. The size and size distribution is preferably based upon the refractive index mismatch of the scattering particle and the host material in which it the scatterer is to be dispersed, and the preselected wavelength(s) to be scattered according to Rayleigh scattering theory. The surface of the scattering particle may further be treated to improve dispersability and stability in the host material. In one embodiment, the scattering particle comprises $TiO_2$ (R902+ from DuPont) of 0.2 μm (micron) particle size, in a concentration in a range from about 0.001 to about 20% by weight. In certain preferred embodiments, the concentration range of the scatterers is between 0.1% and 10% by weight. In certain more preferred embodiments, a composition includes a scatterer (preferably comprising $TiO_2$) at a concentration in a range from about 0.1% to about 5% by weight, and most preferably from about 0.3% to about 3% by weight.

In embodiments including a layer comprising quantum dots dispersed in a composite or host material, preferred composite or host materials include those which are optically transparent and have a refractive index of at least 1.6. In certain preferred embodiments, the composite or host material has an index of refraction in the range from 1.6 to 2.1. In certain other embodiments, the composite or host material has an index of refraction of at least 1.8. Examples include inorganic matrices such as silicon nitride.

Examples of a host material useful in various embodiments and aspect of the inventions described herein include polymers, monomers, resins, binders, glasses, metal oxides, and other nonpolymeric materials. In certain embodiments, an additive capable of dissipating charge is further included in the host material. In certain embodiments, the charge dissipating additive is included in an amount effective to dissipate any trapped charge. In certain embodiments, the host material is non-photoconductive and further includes an additive capable of dissipating charge, wherein the additive is included in an amount effective to dissipate any trapped charge. Preferred host materials include polymeric and non-polymeric materials that are at least partially transparent, and preferably fully transparent, to preselected wavelengths of visible and non-visible light. In certain embodiments, the preselected wavelengths can include wavelengths of light in the visible (e.g., 400-700 nm), ultraviolet (e.g., 10-400 nm), and/or infrared (e.g., 700 nm-12 μm) regions of the electromagnetic spectrum. Preferred host materials include cross-linked polymers and solvent-cast polymers. Examples of preferred host materials include, but are not limited to, glass or a transparent resin. In particular, a resin such as a non-curable resin, heat-curable resin, or photocurable resin is suitably used from the viewpoint of processability. As specific examples of such a resin, in the form of either an oligomer or a polymer, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like. Other suitable host materials can be identified by persons of ordinary skill in the relevant art. Preferably a host material is not a metal.

In certain embodiments, a host material comprises a photocurable resin. A photocurable resin may be a preferred host material in certain embodiments in which the composition is to be patterned. As a photo-curable resin, a photo-polymerizable resin such as an acrylic acid or methacrylic acid based resin containing a reactive vinyl group, a photo-crosslinkable resin which generally contains a photo-sensitizer, such as polyvinyl cinnamate, benzophenone, or the like may be used. A heat-curable resin may be used when the photo-sensitizer is not used. These resins may be used individually or in combination of two or more.

In certain embodiments, a color conversion material including quantum dots further comprises a host material in which the quantum dots are dispersed. In certain embodiments, the composition includes from about 0.001 to about 15 weight percent quantum dots based on the weight of the host material. In certain embodiments, the composition includes from about 0.1 to about 5 weight percent quantum dots based on the weight of the host material. In certain embodiments, the compositon includes from about 1 to about 3 weight percent quantum dots based on the weight of the host material. In certain embodiments, the composition includes from about 2 to about 2.5 weight percent quantum dots based on the weight of the host material. In certain embodiments, the scatterers are further included in the composition in amount in the range from about 0.001 to about 15 weight percent based on the weight of the host material. In certain embodiments, the scatterers are included in amount in the range from about 0.1 to 2 weight percent based on the weight of the host material. In certain embodiments, a host material comprises a binder. Examples of host materials are provided herein.

In certain embodiments, a host material comprises a solvent-cast resin. A polymer such as a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like can be dissolved in solvents known to those skilled in the art. Upon evaporation of the solvent, the resin forms a solid host material for the semiconductor nanoparticles. In certain embodiments, the color conversion material including quantum dots (e.g., semiconductor nanocrystals) and a host material can be formed from an ink composition comprising quantum dots and a liquid vehicle, wherein the liquid vehicle comprises a composition including one or more functional groups that are capable of being cross-linked. The functional units can be cross-linked, for example, by UV treatment, thermal treatment, or another cross-linking technique readily ascertainable by a person of ordinary skill in a relevant art. In certain embodiments, the composition including one or more functional groups that are capable of being cross-linked can be the liquid vehicle itself. In certain embodiments, it can be a co-solvent. In certain embodiments, it can be a component of a mixture with the liquid vehicle. In certain embodiments, the ink can further include scatterers.

In certain embodiments, quantum dots (e.g., semiconductor nanocrystals) are distributed within the host material as individual particles. Preferably the quantum dots are well-dispersed in the host material.

In certain embodiments, outcoupling members or structures may also be included. In certain embodiments, they can be distributed across a surface of the substrate opposite the color conversion material and/or in features in a layer including features including color conversion material. In certain preferred embodiments, such distribution is uniform or substantially uniform. In certain embodiments, coupling members or structures may vary in shape, size, and/or frequency in order to achieve a more uniform light distribution. In certain embodiments, coupling members or structures may be positive, i.e., sitting above the surface of the substrate, or negative, i.e., depressed into the surface of the substrate, or a combination of both. In certain embodiments, one or more features comprising a color conversion material can be applied to a surface of a positive coupling member or structure and/or within a negative coupling member or structure.

In certain embodiments, coupling members or structures can be formed by molding, embossing, lamination, applying a curable formulation (formed, for example, by techniques including, but not limited to, spraying, lithography, printing (screen, inkjet, flexography, etc), etc.)

Color conversion materials including quantum dots and/or films or layers including such color conversion materials can be applied to flexible or rigid substrates. Examples of deposition methods include microcontact printing, inkjet printing, etc. The combined ability to print colloidal suspensions including quantum dots over large areas and to tune their color over the entire visible spectrum makes them an ideal lumophore for solid-state lighting applications that demand tailored color in a thin, light-weight package. Intrinsic QD lifetimes under UV photo-luminescent stress conditions of at least 10,000 hours (with no significant change in brightness), demonstrate the great potential for these printable, inorganic chromophores. An InP/ZnSeS core/shell QD can show similar lifetime performance under similar conditions as shown here for the CdSe systems. The demonstrated photostability properties of quantum dots along with the recent advancements in solid-state quantum yield enable of the above-proposed application of quantum dots. In certain embodiments, a light-emitting device including a component in accordance with the invention including a substrate including at least one layer comprising quantum dots can achieve improved CRI (preferably >85, more preferably >90, most preferably >95) and >90% improvement in external quantum efficiency. In certain preferred embodiments, the device including at least one layer comprising quantum dots disposed over a substrate, and a light-emitting device including same is RoHS compliant.

In certain embodiments including a color conversion material comprising quantum dots dispersed in a composite or host material, the quantum dots will including one or more surface capping ligands attached to a surface of the quantum dots that are chemically compatibility with the composite or host material. The composite or host material can include an organic or inorganic material. In certain embodiments, a device will include more than one composite or host material including quantum dots, wherein each of the quantum dot/composite or host materials combinations is capable of emitting light having a wavelength that is distinct from that emitted by any of the other quantum dot/composite or host material combinations. Preferably a device includes three different quantum dot/composite or host material combinations, each of which emits at a predetermined specific wavelength that is distinct from that of the others included in the device; more preferably 4 different quantum dot/composite or host material combinations, and most preferably, more than 4. The color of the quantum dot emission will include tuning the core emission while maintaining size distribution and quantum efficiency and then growing a thick, graded, alloy shell onto the cores to maximize quantum efficiency and solid state stability. Achieving quantum efficiencies of at least 80% in solution and preserving that efficiency in the solid state host materials will be very important to the success of this development.

In certain embodiments, a component (e.g., a QD-LES) will be RoHS compliant. The RoHS limits are readily identified by one of ordinary skill in the relevant art. In certain preferred embodiments, a component is cadmium free.

High quantum efficiencies (>85%) of Cd-based quantum dots in solution have been achieved. By selecting QD materials that are chemically compatibility with a host material, QDs have been dispersed into various solid materials while maintaining quantum efficiencies of over 50% in the solid state. To maintain high quantum efficiency of QDs, it is preferred to attach capping ligands to quantum dots that are compatible with the chemical nature of the host material, be that an organic or inorganic material.

In certain embodiments, including a color conversion material including quantum dots dispersed in a host material, the quantum dots, prior to being included in the host material, preferably have a quantum efficiency of at least 85%. In certain embodiments, a color conversion material comprising a host material including QD dispersed therein has a quantum efficiency over 50% in the solid state. In certain embodiments, at least a portion of the quantum dots include one or more ligands attached to a surface thereof that are chemically compatible with a host material. To maintain high quantum efficiency of QDs, it is preferred to attach capping ligands to quantum dots that are compatible with the chemical nature of the host material, be that an organic or inorganic material.

In certain embodiments, a color conversion layer includes an amount QDs per area effective to preferably achieve greater than or equal to about 70%, more preferably greater than or equal to about 80%, and most preferably greater than or equal to about 90%, absorption.

In certain embodiments, quantum dots comprise Cd-free QD materials.

The transition from a liquid to a solid dispersion can affect QD efficiencies. It is believed that the speed of this transition is important to maintaining high quantum efficiency, as the rate competition "locks" the QDs into place before aggregation or other chemical effects can occur. Chemically matching the QDs to the host material and controlling the speed of "cure" are believed to be affect quantum efficiency. In certain embodiments, QDs are dispersed in organic host materials such as polymethylmethacrylate (PMMA) and polysiloxanes. For other quantum dot materials and hosts that may be useful with the present invention, see also Lee, et al., "Full Color Emission From II-VI Semiconductor Quantum-Dot Polymer Composites". Adv. Mater. 2000, 12, No. 15 Aug. 2, pp. 1102-1105, the disclosure of which is hereby incorporated herein by reference.

For solid state light applications, film lifetime and index of refraction will be important to performance. In certain embodiments, QDs will be dispersed in an inorganic film ($TiO_2$, for example). Chemically matching the QDs to the inorganic host material and controlling the speed of "cure" will enhance performance. In certain embodiments, the composite or host material can comprise an organic host material such as polysiloxanes.

Prior to the present invention, approaches to increasing light extraction efficiency in OLEDs have included:

(1) Modifying the substrate surface to reduce TIR loss at the substrate/air interface—e.g. with polymer microlenses (S. Moller and S. R. Forrest, *J. Appl. Phys.* 2002, 91, 3324), large area hemispherical lenses (C. F. Madigan, M.-H. Lu, and J. C. Sturm, *Appl. Phys. Lett.* 2000, 76, 1650), silica microspheres (T. Yamasaki, K. Sumioka, and T. Tsutsui, *Appl. Phys. Lett.* 2000, 76, 1243), or mesa structured devices (G. Gu, D. Z. Garbuzov, P. E. Burrows, S. Vankatsh, S. R. Forrest, and M. E. Thompson, *Opt. Lett.* 1997, 22, 396).

(2) Modifying the substrate to reduce TIR loss at the substrate/ITO interface—e.g. by inserting a low-refractive index silica aerogel porous layer between the ITO and glass substrate (T. Tsutsui, M. Tahiro, H. Yokogawa, K. Kawano, and M. Yokoyama, *Adv. Mater.* 2001, 13, 1149 and H. Yokogawa, K. Kawano, M. Yokoyama, T. Tsutsui, M. Yahiro, and Y. Shigesato, *SID Int. Symp. Digest Tech. Papers* 2001, 32, 405) or by using a high refractive index substrate (T. Nakamura, N. Tsutsumi, N. Juni, and H. Fugii, *J. Appl. Phys.* 2005, 97, 054505).

(3) Utilizing 2-D photonic crystal (PC) patterns in one or multiple layers within the device structure to reduce waveguiding modes and enhance light out-coupling normal to the substrate surface (Y.-J. Lee, S.-H. Kim, J. Huh, G.-H. Kim, Y.-H. Lee, S.-H. Cho, Y.-C. Kim, Y. R. Do, *Appl. Phys. Lett.* 2003, 82, 3779; Y. R. Do, Y. C. Kim, Y.-W. Song, C.-O. Cho, H. Jeon, Y.-J. Lee, S.-H. Kim, Y.-H. Lee, *Adv. Mater.* 2003, 15, 1214; Y. R. Do, Y.-C. Kim, Y.-W. Song, Y.-H. Lee, *J. Appl. Phys.* 2004, 96, 7629; Y.-C. Kim, S.-H. Cho, Y.-W. Song, Y.-J. Lee, Y.-H. Lee, Y. R. Do, *Appl. Phys. Lett.* 2006, 89, 173502; M. Fujita, K. Ishihara, T. Ueno, T. Asano, S. Noda, H. Ohata, T. Tsuji, H. Nakada, N. Shimoji, *Jpn. J. Appl. Phys.* 2005, 44, 3669; and K. Ishihara, M. Fujita, I. Matsubara, T. Asano, S. Noda, H. Ohata, A. Hirasawa, H. Nakada, N. Shimoji, *Appl. Phys. Lett.* 2007, 90, 111114.

(4) Fabricating micro-cavity structures within the OLED device structure (R. H. Jordan, L. J. Rothberg, A. Dodabalapur, and R. E. Slusher, *Appl. Phys. Lett.* 1996, 69, 1997; and H. J. Peng, M. Wong, and H. S. Kwok, *SID Int. Symp. Digest Tech. Papers* 2003, 34, 516).

Despite the fact that all of these approaches have been shown to increase light extraction efficiency, they all have several drawbacks. The approaches in the first category are able to recover the waveguided light confined within the substrate but fail to harness the larger component localized in the high refractive index organic and ITO layers. The methods within the second category aim to out-couple the high-index mode light, but the results to date have suffered from an inability to adequately match the refractive index of ITO and effectively reduce the TIR at the ITO/substrate interface (T. Nakamura, N. Tsutsumi, N. Juni, and H. Fugii, *J. Appl. Phys.* 2005, 97, 054505). Categories three and four typically suffer from strong angular-dependent emission and the PC devices in category three can also be plagued by changes in electrical characteristics, complex processing requirements, and high cost.

To date the largest observed enhancements in extraction efficiency have been in a system employing a PC slab just below the ITO electrode (Y.-C. Kim, S.-H. Cho, Y.-W. Song, Y.-J. Lee, Y.-H. Lee, Y. R. Do, *Appl. Phys. Lett.* 2006, 89, 173502). The approach initially incorporated a high index $SiN_x/SiO_2$ PC layer in an attempt to reduce TIR at the ITO/substrate interface. However, the improvement in extraction efficiency was smaller than expected (~50%) due to corrugated cathodes and losses to surface plasmons between the non-planar cathode and the underlying organic layers. Therefore, further improvements were made by improving the planarity of the device structure. Unfortunately, in order to ensure a flat substrate surface, a lower refractive index spin-on-glass (SOG) was implemented to bridge the gap between the PC patterned substrate and the ITO electrode. The low refractive index of the layer increased reflections at this interface, necessitating both a very thin SOG layer as well as a high-index overcoating of $SiN_X$ to achieve the maximum improvement in extraction efficiency of 85%.

In certain embodiments of the present invention, a component (e.g., QD-LES) includes a high index of refraction (e.g., preferably >1.6, most preferably >1.8) material in combination with scattering agents. Such embodiments can achieve improved light extraction efficiency. In addition to the out-coupling efficiency, in certain embodiments, a component can be tuned to function as an extremely precise color converter. Source light will be concentrated via waveguide-mode in the component, where it will probabilistically interact with a QD/scatterer formulation, converting a percentage of the photons into precisely tuned wavelengths while scattering waveguided light out of the device to contribute to EQE and power efficiency. The resultant light can be tuned to extremely high CRIs (e.g., >85, >90, >95) while, due to the light conversion properties and the excellent stability of color conversion material including in the film, maintaining CRI intensity independence over a wide range of light intensities and OLED lifetimes. In certain embodiments, a component can be tuned to convert any light-source containing blue light into a high CRI device, resulting in a highly versatile, highly process compatible, low-cost, and high-stability light-extracting substrate.

In certain embodiments, a film (including, but not limited to, a QD-LEF) comprises multi-layer stack of multi-wavelength films. In certain embodiments, a film comprises multiplexed multi-wavelength QD-LEFs or spatially dithered QD-LEFs. The multi-layer stack embodiment includes multiple (e.g., 2 or more) QD films, ordered from the lowest energy QD film directly underneath the conductor material (e.g., ITO) to the highest energy QD film at the substrate/QD-LEF interface. This structure allows light that is down converted closer to the Ph-OLED or other lighting device to travel unimpeded through subsequent layers, eventually to be out-coupled. In higher energy outer films, the photons emitted that travel back towards the light source, e.g., Ph-OLED, can be recycled by lower energy QDs. In all, though the down conversion efficiency will suffer from minor reabsorption losses, this loss will be most dependent on the quantum yield (QY) of the films, which, at 80% QY, will be limited.

In certain embodiments, a QD-light emitting film comprises spatially dithered or multiplexed multi-wavelength QD-LEFs. In this embodiment, using spatially dithered multi-color QD inks, can also greatly alleviate reabsorption issues. This design separates each QD ink into discrete patterns on the substrate, maintaining a very high absorption path for waveguided blue excitation light while providing a very small absorption path for internally directed down-converted photons. Though waveguided light from the QDs will see this large absorption path as well, the design of the QD-LEF greatly limits the percentage of QD down-converted photons that can enter a waveguide mode. Both film designs are expected to yield higher down-conversion efficiencies than mixed QD films and encapsulants.

Dithering or spatial dithering is a term used, for example, in digital imaging to describe the use of small areas of a predetermined palette of colors to give the illusion of color depth. For example, white is often created from a mixture of small red, green and blue areas. In certain embodiments, using dithering of compositions including different types of quantum dots (wherein each type is capable of emitting light of a different color) disposed on and/or embedded in a surface of a substrate can create the illusion of a different color. In certain embodiments, a film, device and/or component in accordance with embodiments of the invention that appears to emit white light can be created from a dithered pattern of features including, for example, red, green and blue-emitting quantum dots. Dithered color patterns are well known. In certain embodiments, the blue light component of the white light can comprise outcoupled unaltered blue excitation light and/or excitation light that has been down-converted by quantum dots, wherein the quantum dots comprise a composition and size preselected to down-convert the excitation light to blue.

In certain embodiments, white light can be obtained by layering films including different types of quantum dots (based on composition and size) wherein each type is selected to obtain light having a predetermined color.

In certain embodiments, white light can be obtained by including different types of quantum dots (based on composition and size) in separate features or pixels, wherein each type is selected to obtain light having a predetermined color.

In certain embodiments, the quantum dots included in each layer or in each feature or pixel can be included in a composition which further includes a host material. Other additives (e.g., but not limited to, scatterers) can also be included.

As discussed above, in certain embodiments, quantum dots and/or composite or host materials including quantum dots will be included in a QD-LES or light-emitting device that are capable of emitting 3 or more distinctly different predetermined peak emission wavelengths that, in combination, can simulate a white light spectrum. In certain embodiments, the light output has a high CRI, assuming a full-width-at-half-maximum (FWHM) of 35 nm for the QD emission spectra in combination with a blue-emitting light source, e.g., a sky-blue-emitting Ph-OLED. In certain embodiments, core QD materials will comprise Cd-based QD material systems, e.g., CdSe, CdZnSe, and CdZnS. Preferably, core QD materials will be prepared by a colloidal synthesis method. These core semiconductor materials allow for maximized size distribution, surface quality, and color tuning in the visible spectrum. CdZnS can be fine tuned across the entire blue region of the visible spectrum, typically from wavelengths of 400-500 nm. CdZnSe cores can provide narrow band emission wavelengths from 500-550 nm and CdSe is used to make the most efficient and narrow band emission in the yellow to deep red part of the visible spectrum (550-650 nm). Each semiconductor material is chosen specifically to address the wavelength region of interest to optimize the physical size of the QD material, which is important in order to achieve good size distributions, high stability and efficiency, and ease of processibility. In certain embodiments, quantum dots can include a ternary semiconductor alloy. Use of a ternary semiconductor alloy can also permit use of the ratio of cadmium to zinc in addition to the physical size of the core QD to tune the color of emission.

In certain embodiments, a semiconductor shell material for the Cd-based QD cores material comprises ZnS due to its large band gap leading to maximum exciton confinement in the core. The lattice mismatch between CdSe and ZnS is about 12%. The presence of Zn doped into the CdSe decreases this mismatch to some degree, while the lattice mismatch between CdZnS and ZnS is minimal. In order to grow highly uniform and thick shells onto a CdSe cores for maximum particle stability and efficiency a small amount of Cd can be doped into the ZnS growth to create a CdZnS shell that is somewhat graded. In certain embodiments, Cd is doped into the Zn and S precursors during initial shell growth in decreasing amounts to provide a truly graded shell, rich in Cd at the beginning fading to 100% ZnS at the end of the growth phase. This grading from CdSe core to CdS to CdZnS to ZnS can alleviate even more strain potentially allowing for even greater stability and efficiency for solid state lighting applications.

In certain embodiments, QDs comprise cadmium-free materials. Examples include, without limitation, QDs comprising InP or $In_xGa_{x-1}P$. In certain embodiments utilizing these materials, three to four distinctly different peak emission wavelengths can be used to simulate a white light spectrum optimized for high CRI. In certain embodiments, the QD emission spectra in combination with the sky-blue Ph-OLED spectrum exhibit a full-width-at-half-maximum (FWHM) in the range of 45-50 nm or less. In certain embodiments, a predetermined CRI is achieved with 3-4 specifically tuned QD emission spectra. In certain embodiments, core/shell QD comprise a core comprising InP or $In_xGa_{x-1}P$. In certain embodiments, an InP/ZnSeS core-shell system can be tuned from deep red to yellow (630-570 nm), preferably with efficiencies as high as 70%. For creation of high CRI white QD-LED emitters, InP/ZnSeS QDs are used to emit in the red to yellow/green portion of the visible spectrum and $In_xGa_{x-1}P$ is used to provide yellow/green to deep green/aqua-green emission.

In certain embodiments, QD cores comprising InP or $In_xGa_{x-1}P$ will have a shell on at least a portion of the core surface, the shell comprising ZnS. Other semiconductors with a band gap similar to that of ZnS can be used. ZnS has a band gap that can lead to maximum exciton confinement in the core. As discussed above, in certain embodiments utilizing ZnS, InP, and/or $In_xGa_{x-1}P$, a sphalerite (Zinc Blende) phase is adopted by all four semiconductors. The lattice mismatch between GaP and ZnS is less than 1%, while the lattice mismatch between InP and ZnS is about 8%, so doping of Ga into the InP will reduce this mismatch. Further, the addition of a small amount of Se to the initial shell growth may also improve shell growth, as the mismatch between InP and ZnSe is only 3%.

In certain embodiments, a QD Film structure includes quantum dots included in a host material having a high (e.g., preferably >1.6, most preferably >1.8) refractive index.

In certain embodiments, a high refractive index host comprises an organic polymer host. Monomers such as vinyl carbazole and pentabromophenyl methacrylate can be used to make high refractive index polymers (n=1.68-1.71) for waveguides. These monomers can be polymerized by radical polymerization methods using UV initiators.

In certain embodiments, a high refractive index host comprises an inorganic host. In certain embodiments, sol-gel techniques can be used to create high index inorganic hosts for the dots ($TiO_2$, $SiO_2$). Brief exposure to heat can gel the sol and the dots together, and minimize any degradation of the quantum dots.

In certain embodiments, extraction of light from a layer or film comprising quantum dots that is included in a QD-LES can be enhanced by further including light scattering particles in the layer or film. In certain embodiments of an OLED including a QD-LES, inorganic scattering centers such as 200 nm $TiO_2$ can be included in the film to increase the pathlength of the OLED (e.g., Ph-OLED) excitation light, and to help extract quantum dot emission from the film. In certain embodiments including an inorganic film, low index scattering sites such as polymer particles or air can perform the same function.

Quantum dots that emit at different wavelengths across the visible spectrum are preferably employed together in order to achieve a high CR1. Quantum dots differing in emission wavelength can either be mixed together in one layer, or individually layered on top of one another. Whereas the single layer blend is simpler from a process perspective, white emission will require careful consideration of reabsorption of high energy photons by the lower energy dots. A multi-layer approach can minimize reabsorption effects, but will complicate processing. In certain embodiments, a QD film can be deposited by a solution process. In certain embodiments, the thickness of the films (preferably >2.5 um) can be deposited by know high-performance screen printing techniques, whether laying down multiple layers or a blended layer. A screen printing approach is a technique that can be amenable to scale-up in a manufacturing setting.

In certain embodiments, solid-state lighting device includes a light source and a highly efficient energy-coupling architecture including a substrate including a layer comprising quantum dots. In certain embodiments, the light source comprises an OLED.

OLED technology has been widely viewed as having great potential for SSL. Until recently, these devices utilized fluorescent emitter species which, due to their intrinsic, unmodified limitations, could theoretically emit at 5% external efficiency. This is due to the fact that fluorescent small molecule materials can create photons out of only 25% of the electricity they consume, and that in an unmodified device only ~20% of the generated photons escapes wave-guiding. The development of Phosphorescent OLEDs (Ph-OLEDs), first introduced by Prof. Marc Baldo, which can theoretically harvest 100% of consumed energy, has increased this efficiency potential substantially with recent devices exhibiting 40 lm/W with an EQE of 20% (unmodified by further out-coupling enhancements) (N. Ide et al., "Organic Light Emitting Diode (OLED) and its application to lighting devices," SPIE Proceedings, 6333, 63330M (2005)). Similarly, advances in optical out-coupling have improved extraction efficiencies by up to 85% (Y.-C. Kim, S.-H. Cho, Y.-W. Song, Y.-J. Lee, Y.-H. Lee, Y. R. Do, *Appl. Phys. Lett.* 2006, 89, 173502).

In certain embodiments, waveguide-mode dynamics are included with a film or layer comprising quantum dots to provide a low-complexity, low cost, and more effective means of out-coupling blue light (e.g., blue light emitted from a Ph-OLED light) while using QD technology to tune this emission into high CRI light. This can be accomplished by using a high index of refraction (n) QD film between the ITO and the substrate, effectively coupling the light specifically and predominantly into the film via its favorable location and n, as shown in FIG. 3.

FIG. 3(*a*) schematically depicts an example of an embodiment of an example of an embodiment of a lighting device including a QD-LES showing approximate indices of refraction and thicknesses. FIG. 3(*b*) schematically depicts an example of an embodiment of a typical waveguide mode intensity profile for a multi-n material stack (where the maximum n is located in the film including quantum dots) (In certain embodiments, the uppermost layer shown in FIGS. 3(*a*) and 3(*b*) can be a metallic layer approximately 100 nm in thickness.) In certain embodiments additional layers can be included. For example, layers comprising reflective material can be included between any layer including quantum dots and another layer (which could be another layer including quantum dots). In certain embodiments, a reflective layer comprises a higher index material that scatters or reflects light. An example of a preferred reflective material includes silver particles. Other reflective materials can alternatively be used.

In certain embodiments, an air gap or space can be included in a stack of layers including quantum dots in a layered arrangement of color conversion materials to facilitate blue emissions in embodiments including a blue emitting light source. In certain embodiments including an arrangement of pixels or features, the pixels or features can be optically isolated. Optical isolation can be achieve by separating features or pixels by air gap and/or by material having a different refractive index (higher or lower, but not the same). This QD film coupled light is then partially down-converted by the QDs in a probabilistic manner before being scattered out of the film and out of the device.

FIG. 3(*c*) schematically depicts an example of an embodiment of a lighting device including a QD-LES, showing approximate indices of refraction and thicknesses and includes a substrate including a microlens array. FIG. 3(*d*) schematically depicts an example of an embodiment of an example of an embodiment of a lighting device including a component showing a typical waveguide mode intensity profile for a multi-n material stack (where the maximum n is located in the film including quantum dots) (the depicted QD-LES also includes a substrate including a microlens array). In certain embodiments, the uppermost layer shown in FIGS. 3(c) and 3(d) can be a metallic layer approximately 100 nm in thickness.

Figure 3A:
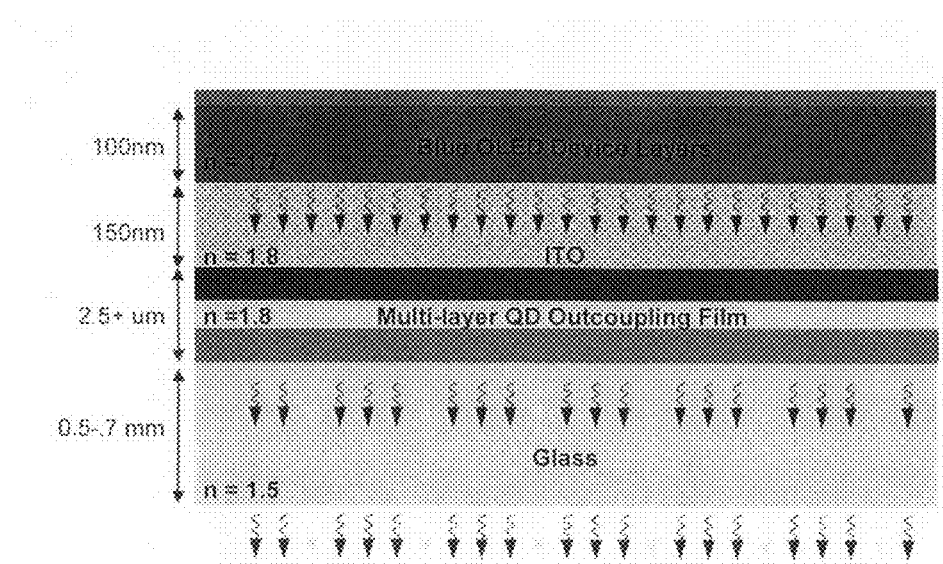
FIG. 3 schematically depicts examples of embodiments of light emitting devices in accordance with the present invention wherein the device includes quantum dots in multi-layer-films ((a) and (c)) and in spatially dithered configurations ((b) and (d)).
Figure 3B:
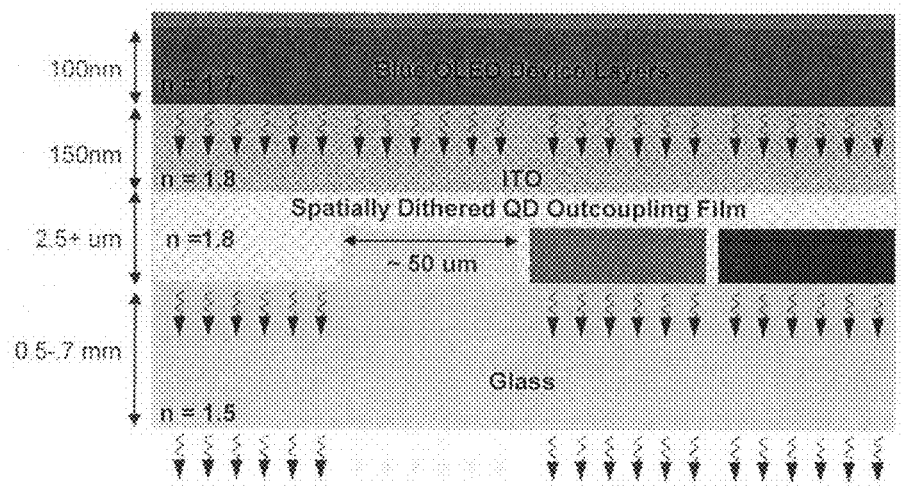
Figure 3C:
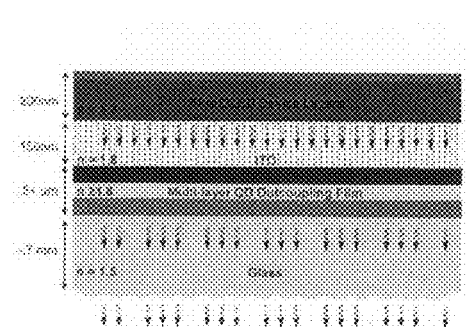
Figure 3D:
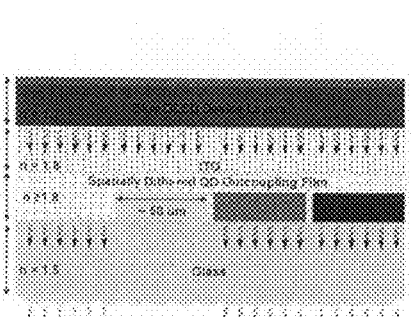

In the embodiments depicted in FIGS. 3(c) and (d), the film including quantum dots coupled light is partially down-converted by the QDs before being scattered out of the film and out of the device by way of an integrated microlens array. Plasmon losses at the cathode are effectively eliminated, as a trivial waveguide mode remains at the interface, while light that would otherwise be wave-guided is scattered into non-critical angles, increasing out-coupling.

In addition to increased light out-coupling, e.g., Ph-OLEDs employing QD-LESs will exhibit tunable high CRI light which is stable over the lifetime of the Ph-OLED. This is the result of immeasurably stable QDs (10,000 hours and counting) combined in a geometry such that the resultant light is uniquely independent of intensity and thus lifetime issues. As light is coupled into the QD-LES, photons will have a probability of being absorbed and re-emitted which, by definition, makes the light output independent of photon flux.

Table 1 below summarizes examples of certain cadmium-containing QD core/shell materials and material performance specifications therefor to achieve high CRI. Colloidal syntheses techniques are preferably used to engineer core-shell QD materials to emit at these predetermined wavelengths. First, core QDs (consisting of CdSe, CdZnSe, and CdZnS) will be synthesized at the desired wavelengths of emission with narrow size distributions and high surface quality. Next, engineered alloy shell materials (CdZnS) will be grown onto the core QDs in order to provide the core surface passivation for high QYs and stability.

In certain embodiments, colloidal syntheses techniques will be used to attach surface ligands to quantum dots. The ligands are preferably selected to be chemically compatible with the inorganic sol-gel and organic host materials to be included in the films including color conversion materials including quantum dots. This approach will provide the most stable and efficient QD films possible.

TABLE 1

Exemplary QD performance targets for QDLS spectrum shown in FIG. 2.

| Color | Examples of Predetermined Peak Wavelength (nm) | Preferred FWHM (nm) | Preferred QY | More Preferred QY | Examples of Preferred Core/Shell Compositions |
|---|---|---|---|---|---|
| Green | 540 | Not greater than 35 | At least 65% | At least 80% | CdZnSe/CdZnS |
| Orange | 585 | Not greater than 35 | At least 65% | At least 80% | CdSe/CdZnS |
| Red | 630 | Not greater than 35 | At least 75% | At least 80% | CdSe/CdZnS |

Table 2 below summarizes examples of certain cadmium-free QD core/shell materials and material performance specifications therefor to achieve high CRI. Colloidal syntheses techniques are preferably used to engineer core-shell QD materials to emit at these predetermined wavelengths. First, core QDs (consisting of $In_xGa_{x-1}P$) will be synthesized at the desired wavelengths of emission with narrow size distributions and high surface quality. Next, a shell material (e.g., a ZnSeS alloy material) will be grown onto the core QDs in order to provide core surface passivation for high QYs and stability.

TABLE 2

Exemplary QD performance targets for QDLS spectrum shown in FIG. 2.

| Color | Examples of Predetermined Peak Wavelength (nm) | Preferred FWHM (nm) | Preferred QY | More Preferred QY | Examples of Preferred Core/Shell Compositions |
|---|---|---|---|---|---|
| Green | 520-550 | Not greater than 50 | At least 60-70% | At least 70-85% | InP/ZnSeS |
| Yellow/Orange | 560-590 | Not greater than 50 | At least 60-70% | At least 70-85% | InP/ZnSeS |
| Red | 610-630 | Not greater than 50 | At least 60-70% | At least 70-85% | $In_xGa_{x-1}P$/ZnSeS |

Examples of components that may be included in a host/QD system include without limitation, quantum dots, monomers, prepolymers, initiators, scattering particles, and other additives. In certain embodiments to be screen-printed, additional additives that may be necessary or desirable for screen printing will be included. Preferably, a layer or film is deposited using a gelling protocol that minimizes heat exposure to quantum dots, as well as a deposition approach capable of multiple layers and patterned QD-LESs.

Preferably the composition for depositing the host/QD system will take into account the surface morphology and be chemically compatible with other materials included with the substrate (e.g., ITO) and Ph-OLED deposition processes.

It is important to note that while, for example, Ph-OLED efficiency is an important selection criterion, device stability and fabrication repeatability are also important considerations to enhance outcoupling and down-conversion using QDs. In addition to light sources comprising Ph-OLEDs, OLEDs, and/or PLEDs any large area planar blue light source can be used with a QD-LES in accordance with the invention.

A computer model can be built to simulate real-world solid-state waveguide modes with scattering in complex material composites with an eye towards high CRI, high efficiency SSL.

Devices can be engineered to achieve predetermined emission color and/or light characteristics by varying layer thicknesses, the composition of color conversion material and the density of scattering media. Angular dependence of emission can also be taken into account using a stepper-motor controlled setup.

In certain embodiments, a component, film, and/or device described herein can include a conductive material that is suitable for use as an anode of a lighting device. An anode typically comprises a high work function (e.g., greater than 4.0 eV) hole-injecting conductor, such as an indium tin oxide (ITO) layer. Examples of light-transmissive or transparent conductive materials suitable for use as an electrode include ITO, conducting polymers, and other metal oxides, low or high work function metals, conducting epoxy resins, or carbon nanotubes/polymer blends or hybrids that are at least partially light transmissive. An example of a conducting polymer that can be used as an electrode material is poly(ethlyendioxythiophene), sold by Bayer AG under the trade mark PEDOT. Other molecularly altered poly(thiophenes) are also conducting and could be used, as well as emaraldine salt form of polyaniline.

In certain embodiments, a component, film, and/or device described herein can include a conductive material that is suitable for use as a cathode, for example, a cathode comprising a low work function (e.g., less than 4.0 eV), electron-injecting, metal, such as Al, Ba, Yb, Ca, a lithium-aluminum alloy (Li:Al), a magnesium-silver alloy (Mg:Ag), or lithium fluoride-aluminum (LiF:Al). The second electrode, such as Mg:Ag, can optionally be covered with a relatively thin layer of substantially transparent ITO for protecting the cathode layer from atmospheric oxidation.

In certain embodiments, a component, film, and/or device described herein includes a substrate that is light transmissive. Preferably, the substrate is at least 80% transparent in the predetermined range of wavelengths of light (visible and/or invisible); more preferably, at least 90% transparent in the predetermined range, and most preferably at least 95% transparent in the predetermined range. In certain embodiments, the predetermined range can be a single wavelength. The substrate can comprise plastic, metal, glass, or semiconductor (e.g., silicon). The substrate can be rigid or flexible.

In certain embodiments, the substrate can comprise a rigid material, e.g., glass, polycarbonate, acrylic, quartz, sapphire, or other rigid materials with adequate transparency.

In certain embodiments, the substrate can comprise a flexible material, e.g., a polymeric material such as plastic or silicone (e.g. but not limited to thin acrylic, epoxy, polycarbonate, PEN, PET, PE), or other flexible material with adequate transparency.

Quantum dots (QDs), preferably semiconductor nanocrystals, permit the combination of the soluble nature and processability of polymers with the high efficiency and stability of inorganic semiconductors. QDs are more stable in the presence of water vapor and oxygen than their organic semiconductor counterparts. Because of their quantum-confined emissive properties, their luminescence is extremely narrow-band and yields highly saturated color emission, characterized by a single Gaussian spectrum. Finally, because the nanocrystal diameter controls the QD optical band gap, fine tuning of absorption and emission wavelength can be achieved through synthesis and structure changes, facilitating the process for identifying and optimizing luminescent properties. Colloidal suspensions of QDs (also referred to as solutions) can be prepared that: (a) emit anywhere across the visible and infrared spectrum; (b) are orders of magnitude more stable than organic lumophores in aqueous environments; (c) have narrow full-width half-maximum (FWHM) emission spectrum (e.g., below 50 nm, below 40 nm, below 30 nm, below 20 nm); and (d) have quantum yields up to greater than 85%.

A quantum dot is a nanometer sized particle, e.g., in the size range of up to about 1000 nm. In certain embodiments, a quantum dot can have a size in the range of up to about 100 nm. In certain embodiments, a quantum dot can have a size in the range up to about 20 nm (such as about 1, 2, 3, 4, 5, 6, 7, 8, 9, 10, 11, 12, 13, 14, 15, 16, 17, 18, 19, or 20 nm). In certain preferred embodiments, a quantum dot can have a size less than 100 Å. In certain preferred embodiments, a nanocrystal has a size in a range from about 1 to about 6 nanometers and more particularly from about 1 to about 5 nanometers. The size of a quantum dot can be determined, for example, by direct transmission electron microscope measurement. Other known techniques can also be used to determine nanocrystal size.

Quantum dots can have various shapes. Examples of the shape of a quantum dot include, but are not limited to, sphere, rod, disk, tetrapod, other shapes, and/or mixtures thereof.

In certain preferred embodiments, QDs comprise inorganic semiconductor material which permits the combination of the soluble nature and processability of polymers with the high efficiency and stability of inorganic semiconductors. Inorganic semiconductor QDs are typically more stable in the presence of water vapor and oxygen than their organic semiconductor counterparts. As discussed above, because of their quantum-confined emissive properties, their luminescence can be extremely narrow-band and can yield highly saturated color emission, characterized by a single Gaussian spectrum. Because the nanocrystal diameter controls the QD optical band gap, the fine tuning of absorption and emission wavelength can be achieved through synthesis and structure change.

In certain embodiments, inorganic semiconductor nanocrystal quantum dots comprise Group IV elements, Group II-VI compounds, Group II-V compounds, Group III-VI compounds, Group III-V compounds, Group IV-VI compounds, Group I-III-VI compounds, Group II-IV-VI compounds, or Group II-IV-V compounds, alloys thereof and/or mixtures thereof, including ternary and quaternary alloys and/or mixtures. Examples include, but are not limited to, ZnO, ZnS, ZnSe, ZnTe, CdO, CdS, CdSe, CdTe, HgO, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbO, PbS, PbSe, PbTe, alloys thereof, and/or mixtures thereof, including ternary and quaternary alloys and/or mixtures.

As discussed herein, in certain embodiments a quantum dot can include a shell over at least a portion of a surface of the quantum dot. This structure is referred to as a core-shell structure. Preferably the shell comprises an inorganic material, more preferably an inorganic semiconductor material, An inorganic shell can passivate surface electronic states to a far greater extent than organic capping groups. Examples of inorganic semiconductor materials for use in a shell include, but are not limited to, Group IV elements, Group II-VI compounds, Group II-V compounds, Group III-VI compounds, Group III-V compounds, Group IV-VI compounds, Group compounds, Group II-IV-VI compounds, or Group II-IV-V compounds, alloys thereof and/or mixtures thereof, including ternary and quaternary alloys and/or mixtures. Examples include, but are not limited to, ZnO, ZnS, ZnSe, ZnTe, CdO, CdS, CdSe, CdTe, HgO, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbO, PbS, PbSe, PbTe, alloys thereof, and/or mixtures thereof, including ternary and quaternary alloys and/or mixtures.

Examples of the most developed and characterized QD materials to date include II-VI semiconductors, including CdSe, CdS, and CdTe. CdSe, with a bulk band gap of 1.73 eV (716 nm) (C. B. Murray, D. J. Norris, M. G. Bawendi, *J. Am. Chem. Soc.* 1993, 115, 8706.), can be made to emit across the entire visible spectrum with narrow size distributions and high emission quantum efficiencies. For example, roughly 2 nm diameter CdSe QDs emit in the blue while 8 nm diameter particles emit in the red. Changing the QD composition by substituting other semiconductor materials with a different band gap into the synthesis alters the region of the electromagnetic spectrum in which the QD emission can be tuned. For example, the smaller band gap semiconductor CdTe (1.5 eV, 827 nm) (C. B. Murray, D. J. Norris, M. G. Bawendi, *J. Am. Chem. Soc.* 1993, 115, 8706) can access deeper red colors than CdSe. An example of another QD material system includes lead containing semiconductors (e.g., PbSe and PbS). For example, PbS with a band gap of 0.41 eV (3027 nm) can be tuned to emit from 800 to 1800 nm (M. A. Hines, G. D. Scholes, *Adv. Mater.* 2003, 15, 1844.). It is theoretically possible to design an efficient and stable inorganic QD emitter that can be synthesized to emit at any desired wavelength from the UV to the NIR.

In certain embodiments, the QD materials are cadmium-free. Examples of cadmium-free QD materials include InP and $In_xGa_{x-1}P$. In an example of one approach for preparing In$_x$Ga$_{x-1}$P, InP can be doped with a small amount of Ga to shift the band gap to higher energies in order to access wavelengths slightly bluer than yellow/green. In an example of another approach for preparing this ternary material, GaP can be doped with In to access wavelengths redder than deep blue. InP has a direct bulk band gap of 1.27 eV, which can be tuned beyond 2 eV with Ga doping. QD materials comprising InP alone can provide tunable emission from yellow/green to deep red; the addition of a small amount of Ga to InP can facilitate tuning the emission down into the deep green/aqua green. QD materials comprising In$_x$Ga$_{x-1}$P (0<x<1) can provide light emission that is tunable over at least a large portion of, if not the entire, visible spectrum. InP/ZnSeS core-shell QDs can be tuned from deep red to yellow with efficiencies as high as 70%. For creation of high CRI white QD-LED emitters, InP/ZnSeS can be utilized to address the red to yellow/green portion of the visible spectrum and In$_x$Ga$_{x-1}$P will provide deep green to aqua-green emission.

Semiconductor QDs grown, for example, in the presence of high-boiling organic molecules, referred to as colloidal QDs, yield high quality nanoparticles that are well-suited for light-emission applications. For example, the synthesis includes the rapid injection of molecular precursors into a hot solvent (300-360° C.), which results in a burst of homogeneous nucleation. The depletion of the reagents through nucleation and the sudden temperature drop due to the introduction of the room temperature solution of reagents minimizes further nucleation. This technique was first demonstrated by Murray and co-workers (C. B. Murray, D. J. Norris, M. G. Bawendi, *J. Am. Chem. Soc.* 1993, 115, 8706) for the synthesis of II-VI semiconductor QDs by high-temperature pyrolysis of organometallic precursors (dimethylcadmium) in coordinating solvents (tri-n-octylphosphine (TOP) and tri-n-octylphosphine oxide (TOPO)). This work was based on the seminal colloidal work by LaMer and Dinegar (V. K. LaMer, R. H. Dinegar, *J. Am. Chem. Soc.* 1950, 72, 4847.), who introduced the idea that lyophobic colloids grow in solution via a temporally discrete nucleation event followed by controlled growth on the existing nuclei.

The ability to control and separate the nucleation and growth environments is in large part provided by selecting the appropriate high-boiling organic molecules used in the reaction mixture during the QD synthesis. Example of high-boiling solvents typically include organic molecules made up of a functional head including, for example, a nitrogen, phosphorous, or oxygen atom, and a long hydrocarbon chain. The functional head of the molecules attach to the QD surface as a monolayer or multilayer through covalent, dative, or ionic bonds and are referred to as capping groups. The capping molecules present a steric barrier to the addition of material to the surface of a growing crystallite, significantly slowing the growth kinetics. It is desirable to have enough capping molecules present to prevent uncontrolled nucleation and growth, but not so much that growth is completely suppressed.

This colloidal synthetic procedure for the preparation of semiconductor QDs provides a great deal of control and as a result the synthesis can be optimized to give the desired peak wavelength of emission as well as a narrow size distribution. This degree of control is based on the ability to change the temperature of injection, the growth time, as well as the composition of the growth solution. By changing one or more of these parameters the size of the QDs can be engineered across a large spectral range while maintaining good size distributions.

Semiconductor QDs such as CdSe are covalently bonded solids with four bonds per atom, which have been shown to retain the bulk crystal structure and lattice parameters (M. G. Bawendi, A. R. Kortan, M. L. Steigerwald, L. E. Brus, *J. Chem. Phys.* 1989, 91, 7282). At the surface of a crystal, the outermost atoms do not have neighbors which they can bond to, generating surface states of different energy levels that lie within the band gap of the semiconductor. Surface rearrangements take place during crystal formation to minimize the energy of these surface atoms, but because such a large percentage of the atoms that make up a QD are on the surface (>75% to <0.5% for QDs<1 nm to >20 nm in diameter, respectively) (C. B. Murray, C. R. Kagan, M. G. Bawendi, *Annu. Rev. Mater. Sci.* 2000, 30, 545), the effect on the emission properties of semiconductor QDs is quite large. The surface states lead to non-radiative relaxation pathways, and thus a reduction in the emission efficiency or quantum yield (QY).

InP and In$_x$Ga$_{x-1}$P are III-V semiconductors and are more covalently bonded crystals than II-VI semiconductors. Separation of the nucleation and growth events from one another and control of the size distribution to the same extent as in II-VI semiconductor QD synthesis is thus a challenge. Because the III-V molecular precursors in general associate more strongly with the elements oxygen, nitrogen, sulfur and phosphorous, compared with the II-VI molecular precursors, a more reactive molecular precursor is required in order to get semiconductor formation at 200-300° C. in solution. The higher reactivity of the precursors causes the nucleation and growth stages to overlap, leading to broader size distributions, lower quality QDs, and lower quantum efficiencies. By tuning the molecular precursor reactivities and exploring how different concentrations of different capping molecules effect nucleation and growth during the reaction in the InP and In$_x$Ga$_{x-1}$P semiconductor systems, we will manipulate and control nucleation and growth to yield tight size distributions, high stability, and high quantum efficiencies.

When molecules are chemically bound or otherwise attached to the surface of a QD, they help to satisfy the bonding requirements of the surface atoms, eliminating many of the surface states and corresponding non-radiative relaxation pathways. This can provide QDs with good surface passivation and higher QY as well as higher stability than QDs with poor surface passivation. Thus, design and control of the growth solution and processing can provide good passivation of the surface states and results in high QYs. Furthermore, these capping groups can play a role in the synthetic process as well by mediating particle growth and sterically stabilizing the QDs in solution.

An effective method for creating QDs with high emission efficiency and stability is to grow an inorganic semiconductor shell onto QD cores. Core-shell type composites rather than organically passivated QDs are desirable for incorporation into solid-state structures, such as a solid state QD-LED device, due to their enhanced photoluminescence (PL) and electroluminescence (EL) quantum efficiencies and a greater tolerance to the processing conditions necessary for device fabrication (B. O. Dabbousi, J. Rodriguez-Viejo, F. V. Mikulec, J. R. Heine, H. Mattoussi, R. Ober, K. F. Jensen, M. G. Bawendi, *J. Phys. Chem. B* 1997, 101, 9463; B. O. Dabbousi, O. Onitsuka, M. G. Bawendi, M. F. Rubner, *Appl. Phys. Lett.* 1995, 66, 1316; M. A. Hines, P. Guyot-Sionnest, *J. Phys. Chem.* 1996, 100, 468; S. Coe-Sullivan, W. K. Woo, J. S. Steckel, M. G. Bawendi, V. Bulović, *Org. Electron.* 2003, 4, 123. When a shell of a larger band gap material is grown onto a core QD, for example ZnS (band gap of 3.7 eV) onto CdSe, the majority of the surface electronic states are passivated and a 2 to 4 fold increase in QY is observed (B. O. Dabbousi, J. Rodriguez-Viejo, F. V. Mikulec, J. R. Heine, H. Mattoussi, R. Ober, K. F. Jensen, M. G. Bawendi, *J. Phys. Chem. B* 1997, 101, 9463). The presence of a shell of a different semiconductor (in particular one that is more resistant to oxidation) on the core also protects the core from degradation.

Due to the superior properties of core-shell materials outlined above, a quantum dot including a core-shell structure is preferred. A factor in QD core-shell development is the crystal structure of the core and shell material as well as the lattice parameter mismatch between the two. The lattice mismatch between CdSe and ZnS is 12% (B. O. Dabbousi, J. Rodriguez-Viejo, F. V. Mikulec, J. R. Heine, H. Mattoussi, R. Ober, K. F. Jensen, M. G. Bawendi, *J. Phys. Chem. B* 1997, 101, 9463), which is considerable, but because only a few atomic layers (e.g., from 1 to 6 monolayers) of ZnS are grown onto CdSe the lattice strain is tolerated. The lattice strain between the core and shell materials scales with the thickness of the shell. As a result, a shell that is too thick can cause dislocations at the material interface and will eventually break off of the core. Doping a shell (e.g., ZnS shell with Cd) can relieve some of this strain, and as a result thicker shells (in this example, CdZnS) can be grown. The effect is similar to transitioning more gradually from CdSe to CdS to ZnS (the lattice mismatch between CdSe and CdS is about 4% and that between CdS and ZnS about 8%), which provides for more uniform and thicker shells and therefore better QD core surface passivation and higher quantum efficiencies.

In certain embodiments including a QD core comprising InP or $In_xGa_{x-1}P$, a preferred semiconductor shell material comprises ZnS. ZnS is preferred due to its large band gap leading to maximum exciton confinement in the core. Preferably, when the QDs comprising ZnS, InP, and/or $In_xGa_{x-1}P$, each is a sphalerite (Zinc Blende) phase material. The lattice mismatch between GaP and ZnS is less than 1%, while the lattice mismatch between InP and ZnS is about 8%, so doping of Ga into the InP will reduce this mismatch. Further, the addition of a small amount of Se to the initial shell growth may also improve shell growth, as the mismatch between InP and ZnSe is only 3%.

While core-shell particles exhibit improved properties compared to core-only systems, good surface passivation with organic ligands is still desirable for maintaining quantum efficiency of core-shell QDs. This is due to the fact that the particles are smaller than the exciton Bohr radius, and as a result the confined excited-state wavefunction has some probability of residing on the surface of the particle even in a core-shell type composite. Strong binding ligands that passivate the surface improve the stability and efficiency of core-shell QD material.

One example of a method for synthesizing quantum dots includes colloidal synthesis techniques as described above, typically exhibit highly saturated color emission with narrow full-width-at-half-maximums (FWHM), preferably less than 30 nm. The number of accessible emission colors is virtually unlimited, due to the fact that the QD peak emission can be tailored by selecting the appropriate material system and size of the nanoparticles. Colloidally synthesized red, green and blue Cd-based QDs can routinely achieve solution quantum yields on the order of 70-80%, with peak emission wavelength reproducibility within +/−2% and FWHM less than 30 nm.

In certain embodiments, QDs include a core comprising InP. Preferably such QDs have a 50% solution quantum yields or higher. In certain embodiments, such QDs are prepared by a colloidal synthesis process. An example of a process for preparing QDs including a core comprising InP or other III-V semiconductor materials is described in U.S. Patent Application No. 60/866,822 of Clough, et al., filed 21 Nov. 2006, the disclosure of which is hereby incorporated herein by reference in its entirety).

InP/ZnSeS QDs can achieve solution quantum yields up to 70%, with peak emission wavelength reproducibility within +/−2% and FWHM less than 60 nm, examples of which are tabulated below in Table 3.

TABLE 3

|  | COLOR | | | | | |
| --- | --- | --- | --- | --- | --- | --- |
|  | Deep Red | Red | Deep Orange | Orange | Yellow/ Orange | Yellow |
| Wavelength peak | 630 nm | 619 nm | 604 nm | 593 nm | 580 nm | 569 nm |
| Quantum Yield | 62% | 63% | 70% | 67% | 60% | 57% |

Quantum dots included in various aspects and embodiments of the inventions contemplated by this disclosure are preferably members of a population of quantum dots having a narrow size distribution. More preferably, the quantum dots comprise a monodisperse or substantially monodisperse population of quantum confined semiconductor nanoparticles.

Examples of other quantum dots materials, methods, and QD-LEDs that may be useful with the present invention include those described in: International Application No. PCT/US2007/13152, entitled "Light-Emitting Devices And Displays With Improved Performance", of Seth Coe-Sullivan, et al., filed Jun. 4, 2007, U.S. Provisional Patent Application No. 60/866,826, filed Nov. 21, 2006, entitled "Blue Light Emitting Semiconductor Nanocrystal Materials And Compositions And Devices Including Same", of Craig Breen et al.; U.S. Provisional Patent Application No. 60/866,828, filed Nov. 21, 2006, entitled "Semiconductor Nanocrystal Materials And Compositions And Devices Including Same", of Craig Breen et al.; U.S. Provisional Patent Application No. 60/866,832, filed Nov. 21, 2006, entitled "Semiconductor Nanocrystal Materials And Compositions And Devices Including Same", of Craig Breen et al.; U.S. Provisional Patent Application No. 60/866,833, filed Nov. 21, 2006, entitled "Semiconductor Nanocrystal And Compositions And Devices Including Same", of Dorai Ramprasad; U.S. Provisional Patent Application No. 60/866,834, filed Nov. 21, 2006, entitled "Semiconductor Nanocrystal And Compositions And Devices Including Same", of Dorai Ramprasad; U.S. Provisional Patent Application No. 60/866,839, filed Nov. 21, 2006, entitled "Semiconductor Nanocrystal And Compositions And Devices Including Same", of Dorai Ramprasad; U.S. Provisional Patent Application No. 60/866,840, filed Nov. 21, 2006, entitled "Blue Light Emitting Semiconductor Nanocrystal And Compositions And Devices Including Same", of Dorai Ramprasad; and U.S. Provisional Patent Application No. 60/866,843, filed Nov. 21, 2006, entitled "Semiconductor Nanocrystal And Compositions And Devices Including Same", of Dorai Ramprasad. The disclosures of each of foregoing listed patent applications are hereby incorporated herein by reference in their entireties.

An example of a deposition technology that may be useful in applying quantum dot materials and films or layers including quantum dot materials to a surface that may be useful with the present invention includes microcontact printing.

QD materials and films or layers including QD materials can be applied to flexible or rigid substrates by microcontact printing, inkjet printing, etc. The combined ability to print colloidal suspensions of QDs over large areas and to tune their color over the entire visible spectrum makes them an ideal lumophore for solid-state lighting applications that demand tailored color in a thin, light-weight package. QDs and films or layer including QDs can be applied to a surface by various deposition techniques. Examples include, but are not limited to, those described in International Patent Application No. PCT/US2007/08873, entitled "Composition Including Material, Methods Of Depositing Material, Articles Including Same And Systems For Depositing Material", of Seth A. Coe-Sullivan, et al., filed Apr. 9, 2007, International Patent Application No. PCT/US2007/09255, entitled "Methods Of Depositing Material, Methods Of Making A Device, And Systems And Articles For Use In Depositing Material", of Maria J, Anc, et al., filed Apr. 13, 2007, International Patent Application No. PCT/US2007/08705, entitled "Methods And Articles Including Nanomaterial", of Seth Coe-Sullivan, et al, filed Apr. 9, 2007, International Patent Application No. PCT/US2007/08721, entitled "Methods Of Depositing Nanomaterial & Methods Of Making A Device" of Marshall Cox, et al., filed Apr. 9, 2007, U.S. patent application Ser. No. 11/253,612, entitled "Method And System For Transferring A Patterned Material" of Seth Coe-Sullivan, et al., filed Oct. 20, 2005, U.S. patent application Ser. No. 11/253,595, entitled "Light Emitting Device Including Semiconductor Nanocrystals", of Seth Coe-Sullivan, et al., filed Oct. 20, 2005, International Patent Application No. PCT/US2007/14711, entitled "Methods for Depositing Nanomaterial, Methods For Fabricating A Device, And Methods For Fabricating An Array Of Devices", of Seth Coe-Sullivan, filed Jun. 25, 2007, International Patent Application No. PCT/US2007/14705, "Methods for Depositing Nanomaterial, Methods For Fabricating A Device, And Methods For Fabricating An Array Of Devices And Compositions", of Seth Coe-Sullivan, et al., filed Jun. 25, 2007, and International Application No. PCT/US2007/14706, entitled "Methods And Articles Including Nanomaterial", of Seth Coe-Sullivan, et al., filed Jun. 25, 2007. Each of the foregoing patent applications is hereby incorporated herein by reference in its entirety.

Additional information concerning quantum dot materials, various methods including quantum dots, and devices including quantum dot materials is included in the following publications are hereby incorporated herein by reference in their entireties: P. Kazlas, J. Steckel, M. Cox, C. Roush, D. Ramprasad, C. Breen, M. Misic, V. DiFilippo, M. Anc, J. Ritter and S. Coe-Sullivan "Progress in Developing High Efficiency Quantum Dot Displays" SID'07 Digest, P176 (2007); G. Moeller and S. Coe-Sullivan "Quantum-Dot Light-Emitting Devices for Displays" SID'06 Digest (2006); J. S. Steckel, B. K. H. Yen, D. C. Oertel, M. G. Bawendi, "On the Mechanism of Lead Chalcogenide Nanocrystal Formation", Journal of the American Chemical Society, 128, 13032 (2006); J. S. Steckel, P. Snee, S. Coe-Sullivan, J. P. Zimmer, J. E. Halpert, P. Anikeeva, L. Kim, M. G. Bawendi, and V. Bulovic, "Color Saturated Green-Emitting QD-LEDs", Angewandte Chemie International Edition, 45, 5796 (2006); P. O. Anineeva, C. F. Madigan, S. A. Coe-Sullivan, J. S. Steckel, M. G. Bawendi, and V. Bulović, "Photoluminescence of CdSe/ZnS Core/Shell Quantum Dots Enhanced by Energy Transfer from a Phosphorescent Donor," Chemical Physics Letters, 424, 120 (2006); Y. Chan, J. S. Steckel, P. T. Snee, J.-Michel Caruge, J. M. Hodgkiss, D. G. Nocera, and M. G. Bawendi, "Blue semiconductor nanocrystal laser", Applied Physics Letters, 86, 073102 (2005); S. Coe Sullivan, W. woo, M. G. Bawendi, V. Bulovic "Electroluminescence of Single Monolayer of Nanocrystals in Molecular Organic Devices", Nature (London) 420, 800 (2002); S. Coe-Sullivan, J. S. Steckel, L. Kim, M. G. Bawendi, and V. Bulovic, "Method for fabrication of saturated RGB quantum dot light-emitting devices", Proc. of SPIE Int. Soc. Opt. Eng., 108, 5739 (2005); J. S. Steckel, J. P. Zimmer, S. Coe-Sullivan, N. Stott, V. Bulović, M. G. Bawendi, "Blue Luminescence from (CdS)ZnS Core-Shell Nanocrystals", Angewandte Chemie International Edition, 43, 2154 (2004); Y. Chan, J. P. Zimmer, M. Stroh, J. S. Steckel, R. K. Jain, M. G. Bawendi, "Incorporation of Luminescent Nanocrystals into Monodisperse Core-Shell Silica Microspheres", Advanced Materials, 16, 2092 (2004); J. S. Steckel, N. S. Persky, C. R. Martinez, C. L. Barnes, E. A. Fry, J. Kulkarni, J. D. Burgess, R. B. Pacheco, and S. L. Stoll, "Monolayers and Multilayers of [Mn12O12(O2CMe)16]", Nano Letters, 4, 399 (2004); Y. K. Olsson, G. Chen, R. Rapaport, D. T. Fuchs, and V. C. Sundar, J. S. Steckel, M. G. Bawendi, A. Aharoni, U. Banin, "Fabrication and optical properties of polymeric waveguides containing nanocrystalline quantum dots", Applied Physics Letters, 18 4469 (2004); D. T. Fuchs, R. Rapaport, G. Chen, Y. K. Olsson, V. C. Sundar, L. Lucas, and S. Vilan, A. Aharoni and U. Banin, J. S. Steckel and M. G. Bawendi, "Making waveguides containing nanocrystalline quantum dots", Proc. of SPIE, 5592, 265 (2004); J. S. Steckel, S. Coe-Sullivan, V. Bulović, M. G. Bawendi, "1.3 μm to 1.55 μm Tunable Electroluminescence from PbSe Quantum Dots Embedded within an Organic Device", Adv. Mater., 15, 1862 (2003); S. Coe-Sullivan, W. Woo, J. S. Steckel, M. G. Bawendi, V. Bulović, "Tuning the Performance of Hybrid Organic/Inorganic Quantum Dot Light-Emitting Devices", Organic Electronics, 4, 123 (2003); and the following patents of Robert F. Karlicek, Jr., U.S. Pat. No. 6,746,889 "Optoelectronic Device with Improved Light Extraction"; U.S. Pat. No. 6,777,719 "LED Reflector for Improved Light Extraction"; U.S. Pat. No. 6,787,435 "GaN LED with Solderable Backside Metal"; U.S. Pat. No. 6,799,864 "High Power LED Power Pack for Spot Module Illumination"; U.S. Pat. No. 6,851,831 "Close Packing LED Assembly with Versatile Interconnect Architecture"; U.S. Pat. No. 6,902,990 "Semiconductor Device Separation Using a Patterned Laser Projection"; U.S. Pat. No. 7,015,516 "LED Packages Having Improved Light Extraction"; U.S. Pat. No. 7,023,022 "Microelectronic Package Having Improved Light Extraction"; U.S. Pat. No. 7,170,100 "Packaging Designs for LEDs"; and U.S. Pat. No. 7,196,354 "Wavelength Converting Light Emitting Devices".

Additional information relating to semiconductor nanocrystals and their use is also found in U.S. Patent Application Nos. 60/620,967, filed Oct. 22, 2004, and Ser. No. 11/032,163, filed Jan. 11, 2005, U.S. patent application Ser. No. 11/071,244, filed 4 Mar. 2005. Each of the foregoing patent applications is hereby incorporated herein by reference in its entirety.

Additional information relating to organic electroluminescent devices (OLEDs) is found in the following publications, each of which is hereby incorporated herein by reference in its entirety: "High efficiency phosphorescent emission from organic electroluminescent devices", M. A. Baldo, D. F. O'Brien, Y. You, A. Shoustikov, S. Sibley, M. E. Thompson and S. R. Forrest. Nature. 395. 151-154 (1998); "High efficiency fluorescent organic light-emitting devices using a phosphorescent sensitizer", M. A. Baldo, M. E. Thompson and S. R. Forrest. Nature. 403. 750-753 (2000); "The prospects for electrically-pumped organic lasers", M. A. Baldo, R. J. Holmes and S. R. Forrest. Physical Review B. 66. 035321 (2002); "Very high-efficiency green organic light-emitting devices based on electro-phosphorescence", M. A. Baldo, S. Lamansky, P. E. Burrows, M. E. Thompson and S. R. Forrest. Applied Physics Letters. 75. 4-6 (1999); "Simplified calculation of dipole energy transport in a multilayer stack using dyadic Green's functions", K. Celebi, T. D. Heidel, and M. A. Baldo. Optics Express, 15 1762-1772 (2007); "Extrafluorescent Electroluminescence in Organic Light Emitting Devices", M. Segal, M. Singh, K. Rivoire, S. Difley, T. Van Voorhis, and M. A. Baldo. Nature Materials. 6. 374-378 (2007); "Saturated and efficient blue phosphorescent organic light emitting devices with Lambertian angular emission", Mulder, C. L., K. Celebi, K. M. Milaninia, and M. A. Baldo. Applied Physics Letters. 90. 211109 (2007); and "Excitonic singlet triplet ratios in molecular and polymeric organic semiconductors", M. Segal, M. A. Baldo, R. J. Holmes, S. R. Forrest, and Z. G. Soos. Physical Review B. 68. 075211 (2003).

As used herein, "top" and "bottom" are relative positional terms, based upon a location from a reference point. More particularly, "top" means farthest away from the substrate, while "bottom" means closest to the substrate. For example, for a light-emitting device that optionally includes two electrodes, the bottom electrode is the electrode closest to the substrate, and is generally the first electrode fabricated; the top electrode is the electrode that is more remote from the substrate, on the top side of the light-emitting material. The bottom electrode has two surfaces, a bottom surface closest to the substrate, and a top surface further away from the substrate. Where, e.g., a first layer is described as disposed or deposited "over" a second layer, the first layer is disposed farther away from substrate. There may be other layers between the first and second layer, unless it is otherwise specified. For example, a cathode may be described as "disposed over" an anode, even though there are various organic and/or inorganic layers in between.

As used herein, the singular forms "a", "an" and "the" include plural unless the context clearly dictates otherwise. Thus, for example, reference to a nanomaterial includes reference to one or more of such materials.

All the patents and publications mentioned above and throughout are incorporated in their entirety by reference herein. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A component comprising a substrate comprising a material that is transparent to light within a predetermined range of wavelengths, a layered arrangement including two or more layers disposed over a predetermined region of a surface of the substrate, wherein each of the layers comprises a color conversion material comprising quantum dots capable of emitting light having a predetermined wavelength that is distinct from that emitted by quantum dots included in one or more of the other layers, and conductive material disposed over at least a portion of the layered arrangement, the conductive material being transparent to light within a second predetermined range of wavelengths, and one or more outcoupling features disposed on a surface of the substrate opposite the color conversion material.

2. A component in accordance with claim 1 wherein each layer is capable of emitting light at a wavelength that is distinct from that of any of the other layers.

3. A component in accordance with claim 1 wherein layers are arranged in order of decreasing wavelength from the conductive material with the layer capable of emitting light at the highest wavelength being closest to the conductive material and the layer capable of emitting light at the lowest wavelength being farthest from the conductive material.

4. A component in accordance with claim 1 wherein the layered arrangement includes a first layer including quantum dots capable of emitting red light, a second layer including quantum dots capable of emitting orange light, a third layer including quantum dots capable of emitting yellow light, a fourth layer including quantum dots capable of emitting green light, and a fifth layer including quantum dots capable of emitting blue light.

5. A component in accordance with claim 1 wherein the layered arrangement includes a first layer including quantum dots capable of emitting red light, a second layer including quantum dots capable of emitting orange light, a third layer including quantum dots capable of emitting yellow light, a fourth layer including quantum dots capable of emitting green light, and a fifth layer including scatterers or non-scattering material to outcouple light.

6. A component in accordance with claim 1 wherein the layered arrangement includes a first layer including quantum dots capable of emitting blue light, a second layer including quantum dots capable of emitting green light, a third layer including quantum dots capable of emitting yellow light, and a fourth layer including quantum dots capable of emitting red light.

7. A component in accordance with claim 1 wherein the layered arrangement includes a first layer including optically transparent scatterers or non-scattering material, a second layer including quantum dots capable of emitting green light, a third layer including quantum dots capable of emitting yellow light, and a fourth layer including quantum dots capable of emitting red light.

8. A component in accordance with claim 1 wherein the layered arrangement includes a first layer including quantum dots capable of emitting red light, a second layer including quantum dots capable of emitting green light, and a third layer m including quantum dots capable of emitting blue light.

9. A component in accordance with claim 1 wherein the layered arrangement includes a first layer including quantum dots capable of emitting red light, a second layer including quantum dots capable of emitting green light, and a third layer including scatterers or non-scattering material to outcouple light.

10. A component in accordance with claim 1 wherein the layered arrangement includes a first layer including quantum dots capable of emitting blue light, and a second layer including quantum dots capable of emitting yellow light.

11. A component in accordance with claim 1 wherein the layered arrangement includes a first layer including quantum dots capable of emitting yellow light, and a second layer including scatterers or non-scattering material to outcouple light.

12. A lighting device including a component in accordance with claim 1, wherein the conductive material acts as an electrode of the device.

13. A component in accordance with claim 1 wherein the substrate comprises a waveguide.

14. A component in accordance with claim 1 wherein the substrate is flexible.

15. A component in accordance with claim 1 wherein the substrate is rigid.

16. A component in accordance with claim 1 wherein the component further includes a thin film interference filter between the substrate and color conversion material.

17. A component in accordance with claim 1 wherein the outcoupling features comprise a microlens.

18. A component in accordance with claim 1 wherein the outcoupling feature comprise a micro-relief structure.

19. A component in accordance with claim 1 wherein at least a portion of the outcoupling features are configured to have predetermined outcoupling angles.

20. A component in accordance with claim 1 wherein at least a portion of the outcoupling features include a substantially hemispherical surface.

21. A component in accordance with claim 1 wherein at least a portion of the outcoupling features include a curved surface.

22. A component in accordance with claim 1 wherein the color conversion material further comprises a host material in which the quantum dots are dispersed.

23. A component in accordance with claim 1 wherein the color conversion material further comprises a binder in which the quantum dots are dispersed.

24. A component in accordance with claim 1 wherein the color conversion material has an index of refraction greater than or equal to the index of refraction of the conductive material.

25. A component in accordance with claim 22 wherein the host material is transparent to light in the predetermined range of wavelengths and light in the second predetermined range of wavelengths.

26. A component in accordance with claim 22 wherein the host material comprises an organic material.

27. A component in accordance with claim 22 wherein the host material comprises an inorganic material.

28. A component in accordance with claim 22 wherein the host material has an index of refraction greater than or equal to the index of refraction of the conductive material.

29. A component in accordance with claim 1 wherein the color conversion material further includes scatterers.

30. A component in accordance with claim 1 wherein light emitted from the surface of the component is substantially uniform across a predetermined region of the substrate surface.

31. A component in accordance with claim 1 a reflective material is included on the edges of the substrate.

32. A component in accordance with claim 1 a reflective material is included around at least a portion of the edges of the substrate.

* * * * *